US010205424B2

(12) United States Patent
Hellberg

(10) Patent No.: US 10,205,424 B2
(45) Date of Patent: Feb. 12, 2019

(54) COMPOSITE POWER AMPLIFIER

(71) Applicant: TELEFONAKTIEBOLAGET LM ERICSSON (PUBL), Stockholm (SE)

(72) Inventor: Richard Hellberg, Huddinge (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 15/568,891

(22) PCT Filed: May 12, 2015

(86) PCT No.: PCT/SE2015/050529
§ 371 (c)(1),
(2) Date: Oct. 24, 2017

(87) PCT Pub. No.: WO2016/182485
PCT Pub. Date: Nov. 17, 2016

(65) Prior Publication Data
US 2018/0102744 A1    Apr. 12, 2018

(51) Int. Cl.
H03F 1/02        (2006.01)
H03F 3/24        (2006.01)
(Continued)

(52) U.S. Cl.
CPC ............ H03F 1/0288 (2013.01); H03F 1/42 (2013.01); H03F 1/56 (2013.01); H03F 3/19 (2013.01);
(Continued)

(58) Field of Classification Search
USPC ............................... 330/286, 124 R, 295, 84
See application file for complete search history.

(56) References Cited

U.S. PATENT DOCUMENTS 3,593,174 A    7/1971  White
8,928,402 B2*  1/2015  Gajadharsing ........ H03F 1/0294
                                              330/124 R
(Continued)

FOREIGN PATENT DOCUMENTS

WO    2003/061115 A1    7/2003
WO    2010/068152 A1    6/2010
(Continued)

OTHER PUBLICATIONS

Klopfenstein, R. W.; "A transmission line taper of improved design"; Proc. IRE, vol. 44; Jan. 1956; pp. 31-35.
(Continued)

Primary Examiner — Hieu Nguyen
(74) Attorney, Agent, or Firm — Patent Portfolio Builders PLLC

(57) ABSTRACT

A composite power amplifier for amplification of an input signal into an output signal is disclosed. The composite power amplifier comprises an input port for receiving the input signal, and an output port for providing the output signal. Furthermore, the composite power amplifier comprises a first set of sub-amplifiers, comprising at least two sub-amplifiers, wherein the at least two sub-amplifiers are arranged along a taper of a first transmission line, wherein the first transmission line is connected to the first set of sub-amplifiers and the output port. Moreover, the composite power amplifier comprises a second set of sub-amplifiers, comprising at least two sub-amplifiers, wherein the at least two sub-amplifiers are arranged along a taper of a second transmission line, wherein the second transmission line is connected to the second set of sub-amplifiers and the output port.

9 Claims, 18 Drawing Sheets

(51) Int. Cl.
  *H03F 3/19*   (2006.01)
  *H03F 3/60*   (2006.01)
  *H03F 1/56*   (2006.01)
  *H03F 1/42*   (2006.01)
  *H03F 3/191*  (2006.01)

(52) U.S. Cl.
  CPC ............. *H03F 3/191* (2013.01); *H03F 3/245* (2013.01); *H03F 3/602* (2013.01); *H03F 2200/451* (2013.01)

(56) References Cited

U.S. PATENT DOCUMENTS

| 2002/0084844 | A1 | 7/2002 | Monroe |
| 2006/0044060 | A1 | 3/2006 | Shiikuma |
| 2010/0045385 | A1 | 2/2010 | Pengelly |
| 2012/0056669 | A1 | 3/2012 | Fraysse et al. |
| 2013/0021104 | A1 | 1/2013 | Schmidt |

FOREIGN PATENT DOCUMENTS

| WO | 2010/074615 A1 | 7/2010 |
| WO | 2014/193275 A1 | 12/2014 |
| WO | 2015/057118 A1 | 4/2015 |

OTHER PUBLICATIONS

H. Chireix, "High Power Outphasing Modulation", Proceedings of the Institute of Radio Engineers, Nov. 1935, pp. 1370-1392, vol. 23, No. 11.
Luca Piazzon et al., "A Method for Designing Broadband Doherty Power Amplifiers", Progress in Electromagnetics Research, 2014, pp. 319-331, vol. 145.
R.E. Collin, "Theory and Design of Wide-Band Multisection Quarter-Wave Transformers", Proceedings of the I-R-E, Feb. 1955, pp. 179-185.
W.H. Doherty, "A New High Efficiency Power Amplifier for Modulated Waves", Proceedings of the Institute of Radio Engineers, Sep. 1936, pp. 1163-1182, vol. 24, No. 9.
International Search Report and Written Opinion, dated Jan. 28, 2016, from corresponding PCT Application No. PCT/SE2015/050529.
Supplementary European Search Report dated Nov. 9, 2018. (All references not cited herewith have been previously made of record.).

* cited by examiner

Electrical length at center frequency

COMPOSITE POWER AMPLIFIER

The present application is a National Stage of PCT Application No. PCT/SE2015/050529, filed May 12, 2015, the entire contents of which is hereby incorporated by reference.

TECHNICAL FIELD

Embodiments herein relate to composite power amplifiers for wireless communication systems, such as telecommunication systems. In particular, a composite power amplifier for amplification of an input signal into an output signal is disclosed. Furthermore, a radio network node, comprising the composite power amplifier, and a user equipment, comprising the composite power amplifier, are disclosed.

BACKGROUND

Power amplifiers are widely used in communication systems, for example in radio base stations and cellular phones of a cellular radio network. In such cellular radio network, power amplifiers typically amplify signals of high frequencies for providing a radio transmission signal. A consideration in the design of power amplifiers is the efficiency thereof. High efficiency is generally desirable so as to reduce the amount of power that is dissipated as heat. Moreover, in many applications, such as in a satellite or a cellular phone, the amount of power that is available may be limited due to powering by a battery, included in e.g. the satellite. An increase in efficiency of the power amplifier would allow an increase of operational time between charging of the battery.

A conventional Power Amplifier (PA), such as Class B, AB, F, has a fixed Radio Frequency (RF) load resistance and a fixed Direct Current (DC) voltage supply. The RF output current of a Class B or AB PA has a form similar to that of a pulse train comprising half wave rectified sinusoid current pulses. The DC Current, and hence DC power, is largely proportional to the RF output current amplitude. The output power, however, is proportional to the RF output current squared. An efficiency of the conventional power amplifier, i.e. output power divided by DC power, is therefore also proportional to the RF output current amplitude. The average efficiency is consequentially low when amplifying signals that on average have a low output signal amplitude, or power, compared to the maximum required output signal amplitude.

Known RF power amplifiers include both Doherty and Chireix type power amplifiers, i.e. a modified class B radio frequency amplifier. These kinds of RF PAs are generally more efficient than the conventional amplifier described above for amplitude-modulated signals with high Peak-to-Average Ratio (PAR), since they have a lower average sum of output currents from the transistors comprised in the PA. Reduced average output current means high average efficiency. In this context, the term "composite power amplifier" refers to power amplifiers which may be operated in one or more modes, such as a pure or detuned Doherty, Chireix, combined Doherty/Chireix or combined Chireix/Doherty mode, etc.

The reduced average output current is obtained by using two transistors that influence each other's output voltages and currents through a reactive output network, which is coupled to a load. By driving the constituent transistors with the right amplitudes and phases, the sum of RF output currents is reduced at all input signal levels within an operating range, except a maximum of the operating range. Also for these power amplifiers the RF voltage at one or both transistor outputs is increased.

Generally, RF power amplifier can be driven in a so called backed off operation. This means that the power amplifier is operated at a certain level, e.g. expressed as a number of decibels (dBs), under its maximum output power. Backed off operation may also refer to that an instantaneous output power is relatively low.

Wideband Doherty amplifiers are a subject of much interest, and many approaches have been attempted. For example, using a quarter wavelength transmission line with the same impedance as the load results in wideband efficiency at the transition point, as disclosed in a paper by D. Gustafsson et al., entitled "Theory and design of a novel wideband and reconfigurable high average efficiency amplifier, Proc. IMS 2012. In a standard Doherty amplifier, the transition point is at half the maximum output voltage.

In patent application WO2003/061115, filed by the present Applicant, a wideband amplifier with 100% relative bandwidth, i.e. having a 3:1 of high band edge to low band edge ratio is disclosed. The central mode of such an amplifier is a wideband Doherty mode. The disclosed wideband amplifier comprises two-stage high efficiency amplifiers with increased robustness against circuit variations and with radically increased bandwidth of high efficiency.

The wideband multistage amplifiers disclosed in patent application WO2003/061115 or PCT/SE2013/051217 have different operating modes in different frequency bands, which results in a disadvantage of complicating the input drive circuits. The central Doherty mode of the amplifier in WO2003/061115 can be up to about 60% wideband, but output signal amplitude at the transition point then varies considerably within the bandwidth.

A Doherty amplifier that has a quarter wavelength line with the same impedance as the load, for example as disclosed in the paper mentioned above by Gustafsson et al., has the disadvantage of requiring a different supply voltage to each of the two sub-amplifiers. This results in an oversized and underutilized main transistor in case the same technology is used for both sub-amplifiers. The wideband efficiency at the transition point is obtained by sacrificing both wideband transistor utilization and efficiency at maximum power, which reduces the bandwidth of high average efficiency as well as increases transistor cost.

Using an LC-resonator, for example as disclosed in a paper by M. Naseri Ali Abadi et al., entitled "An Extended Bandwidth Doherty Power Amplifier using a Novel Output Combiner", Proc. IMS 2014, or using a resonant stub at the output node has the drawback of decreasing the full power bandwidth and efficiency bandwidth at full power.

In a paper by Piazzon et al., entitled "A method for Designing Broadband Doherty Power Amplifiers", Progress in Electromagnetics Research, Vol. 145, pp 319-331, 2014, or in a paper by R Giofrè et al., entitled "A Distributed Matching/Combining Network Suitable to Design Doherty Power Amplifiers Covering More Than an Octave Bandwidth", Proc. IMS 2014, another technique involving the use of a multi-section branch line coupler is disclosed. This technique has a limitation in the efficiency bandwidth both at the transition point and at full power, and also has a limitation in power bandwidth at full power

SUMMARY

An object is to provide a composite power amplifier of the above mentioned kind, such as a Doherty amplifier, which overcomes, or at least mitigates, at least one of the above mentioned problems.

According to an aspect, the object is achieved by a composite power amplifier for amplification of an input signal into an output signal. The composite power amplifier comprises an input port for receiving the input signal and an output port for providing the output signal. Moreover, the composite power amplifier comprises a first set of sub-amplifiers, comprising at least two sub-amplifiers. The at least two sub-amplifiers are arranged along a taper of a first transmission line. The first transmission line is connected to the first set of sub-amplifiers and the output port. Furthermore, the composite power amplifier comprises a second set of sub-amplifiers, comprising at least two sub-amplifiers. The at least two sub-amplifiers are arranged along a taper of a second transmission line. The second transmission line is connected to the second set of sub-amplifiers and the output port.

According to another other aspect, the object is achieved by a radio network node, comprising the composite power amplifier.

According to a further aspect, the object is achieved by a user equipment, comprising the composite power amplifier.

According to the embodiments herein, the first and second set of sub-amplifiers comprises the at least two sub-amplifiers. These at least two sub-amplifiers are arranged along a respective tapered transmission line to provide in-phase combing of the time delayed versions of the input signal.

Thanks to the first and second tapered transmission lines back-off of a high efficiency may be increased for any composite power amplifier.

With the embodiments herein, composite power amplifiers may be built with wide amplitude ranges of high efficiency over any relative bandwidth or number of bands. Efficiency and bandwidth may be tuned, e.g. optimized, independently from each other.

The composite power amplifier according to the embodiments herein may be designed to operate with uniform drive signals in a single wide band mode and have parameters, such as transition point amplitudes, output phase, efficiency, close to constant across an operational frequency range of the composite power amplifier. With certain properties for the sub-amplifier sets, it is possible to make a cascade of any number of transition points.

Various embodiments herein includes quarter-wave, unequal-length and continuous tapered transmission lines. Moreover, embodiments include sets of sub-amplifiers with only few up to many sub-amplifiers. Furthermore, embodiments of the composite power amplifier herein include narrowband as well as wideband implementations. The embodiments herein may be combined with many other amplifier techniques and enables improved high-frequency operation.

BRIEF DESCRIPTION OF THE DRAWINGS

The various aspects of embodiments disclosed herein, including particular features and advantages thereof, will be readily understood from the following detailed description and the accompanying drawings, in which.

DETAILED DESCRIPTION

Figure 1:
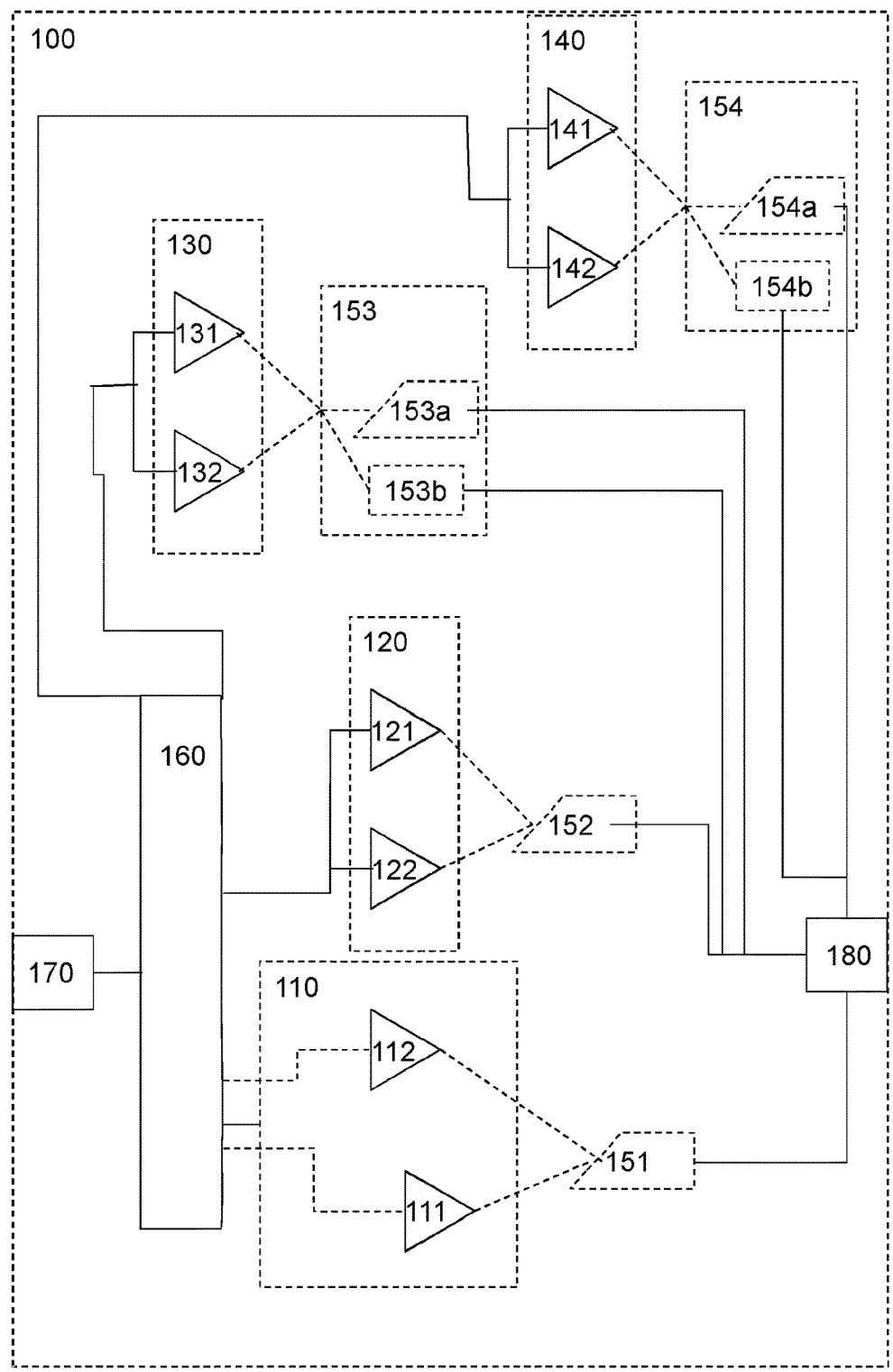
FIG. 1 is a block diagram of the composite power amplifier according to embodiments herein.

Throughout the following description similar reference numerals have been used to denote similar features, such as elements, units, modules, circuits, nodes, parts, items or the like, when applicable. In the Figures, features that appear in some embodiments are indicated by dashed lines.

FIG. 1 illustrates a composite power amplifier 100 for amplification of an input signal into an output signal.

The composite power amplifier 100 comprises an input port 170 for receiving the input signal, and an output port 180 for providing the output signal.

Moreover, the composite power amplifier 100 comprises a first set 110 of sub-amplifiers, comprising at least two sub-amplifiers 111, 112. The at least two sub-amplifiers 111, 112 are arranged along a taper of a first transmission line 151. The first transmission line 151 is connected to the first set 110 of sub-amplifiers and the output port 180.

Furthermore, the composite power amplifier 100 comprises a second set 120 of sub-amplifiers, comprising at least two sub-amplifiers 121, 122. The at least two sub-amplifiers 121, 122 are arranged along a taper of a second transmission line 152. The second transmission line 152 is connected to the second set 120 of sub-amplifiers and the output port 180.

As mentioned, the sub-amplifiers 111, 112, 121, 122 are arrange along the taper of their respective transmission lines 151, 152. This means that the sub-amplifiers are located at respective steps of the taper of their respective transmission line 151, 152. Signals from each of the sub-amplifiers are in-phase combined before, or at, the output port 180 thanks to an incoming first transmission line 160 (shown with dashed-lines 1401, 1402 in FIG. 14 below), connected to the input port 170 and the first set of sub-amplifiers 110, which incoming first transmission line 160 has a taper that corresponds to, in terms of achieving in-phase combining at the output port, the tapers of the their respective transmission lines 151, 152.

Furthermore, the composite power amplifier 100 may be configured with a first transition point related to amplitude of the input signal. The first transition point is related to amplitude of the input signal, since the input signal is configured according to the first transition point given as a portion of the full output amplitude. The transition point has a significance for defining various embodiments herein.

In some embodiments, the composite power amplifier 100 may be configured to operate only the first set 110 of sub-amplifiers below the first transition point. With reference to well-known terms for a Doherty amplifier, this means that the first set of sub-amplifiers are operated as main amplifier(s) and the second set of sub-amplifiers 120 are operated as peaking amplifier(s).

In some further embodiment, the composite power amplifier 100 comprises a third set 130 of sub-amplifiers. A third transmission line 153 is connected to the third set 130 of sub-amplifiers and the output port 180. The composite power amplifier 100 is configured to operate only the third set 130 of sub-amplifiers below the first transition point. In this embodiment, the first and second sets 110, 120 of sub-amplifiers are operated as peaking amplifiers and the third set of sub-amplifiers is operated as main amplifier(s).

The composite power amplifier 100 may comprise multiple sets of sub-amplifiers, or groups of sub-amplifiers, distributed along a tapered or stepped impedance transmission line. Each set is associated with a transition point, which is also reflected in the input signal, or drive signal, to the set. In a preferred embodiment, the sub-amplifiers are placed according to the lengthwise admittance increase of the transmission line, which is determined by impedance transformation requirements. In order to tune operation for a certain circuit complexity, each set of sub-amplifiers is distributed along a length of transmission line that is in itself a good transformer for the required bandwidth and the transformation ratio within the set. To simplify both the cascading of sets and the drive signals, the sets can preferably be fully transformed, i.e. with very little residual load modulation. However, to reduce the electrical length and the number of sub-amplifiers, residual load modulation is allowed and lower weighting is applied to the RF output currents at the transition point relative to those at full output current. The embodiments herein enable distributed amplifier techniques for all groups of sub-amplifiers, and enables combinations with many other amplifier techniques as well.

Figure 12:
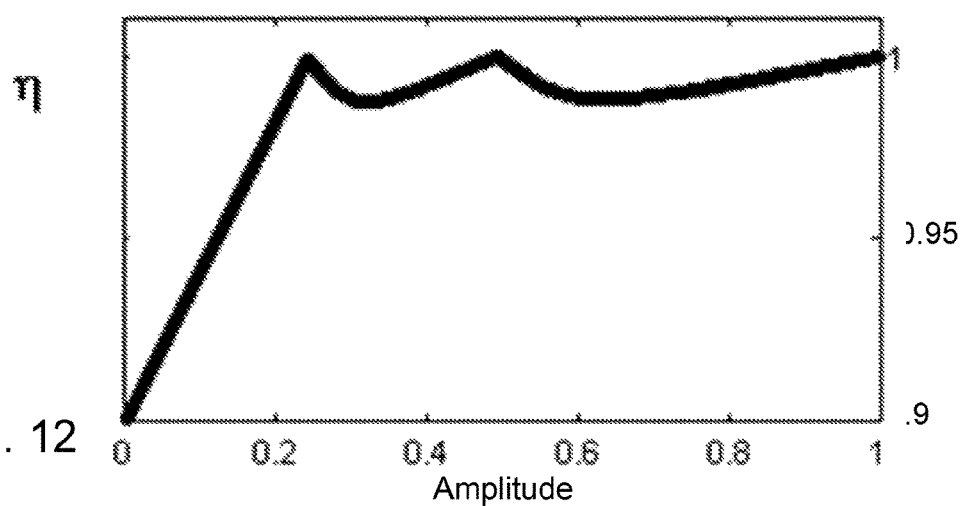
FIG. 12 illustrates a diagram in which efficiency as a function of amplitude of input signal is plotted.

In some still further embodiments, the composite power amplifier 100 may comprise a fourth set 140 of sub-amplifiers. A fourth transmission line 154 may be connected to the fourth set 140 of sub-amplifiers and the output port 180. The composite power amplifier 100 may be configured to operate only the fourth set 140 of sub-amplifiers above a third transition point related to amplitude of the input signal. This embodiment is further elaborated with reference to FIG. 12 below.

For ease of description, the following embodiments will assume the first set to be operated as main amplifier(s) and the second set, and any existing additional sets, are assumed to be operated as peaking amplifier(s).

In case the first set of sub-amplifiers is not good enough, it may be possible to allow the remainder of the composite power amplifier, e.g. the second and/or third sets, to compensate or improve conditions for the first set.

Figure 2:
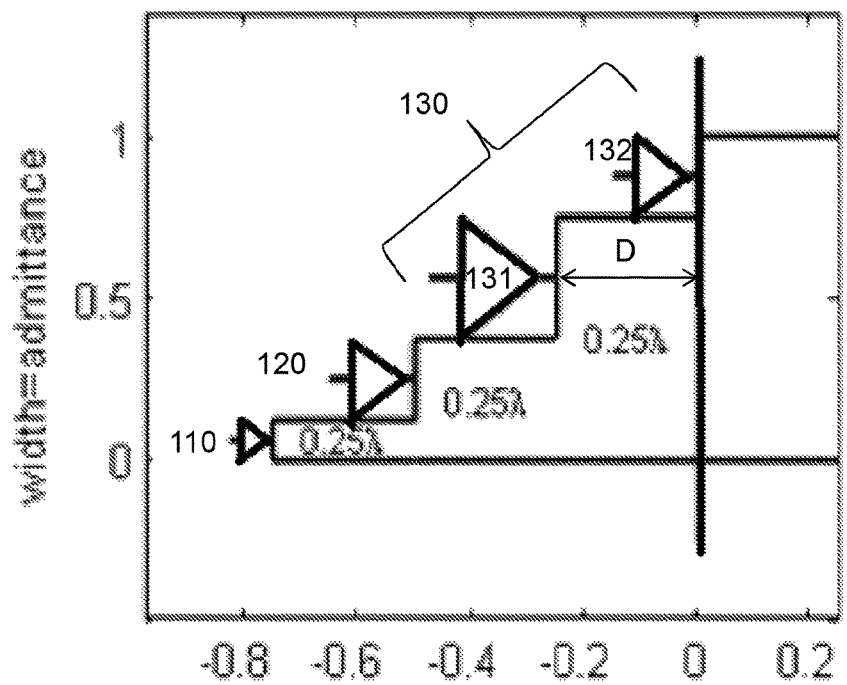
FIG. 2 is an illustration of tapering for an exemplifying composite power amplifier.

An example of this is an exemplifying composite power amplifier comprising three sets, where the sets comprises 1, 1, and 2 sub-amplifiers, respectively, and with relative sizes 1, 2, 3 and 2, i.e. relative RF output currents, as shown in FIG. 2. Associated admittance steps thus also have size 1, 2, 3 and 2 as evident from height of steps in FIG. 2. In this example, the first set 110 includes only one sub-amplifier and the second set 120 includes only one sub-amplifier. The third set 130 includes two amplifiers, whose difference D in transmission line is 0.25 Å, at center frequency of an operational frequency range of the composite power amplifier 100, due to tapering. A first and second transmission line associated with the first and second sets of sub-amplifiers, respectively, also have a respective electrical length of 0.25 Å.

Figure 3:
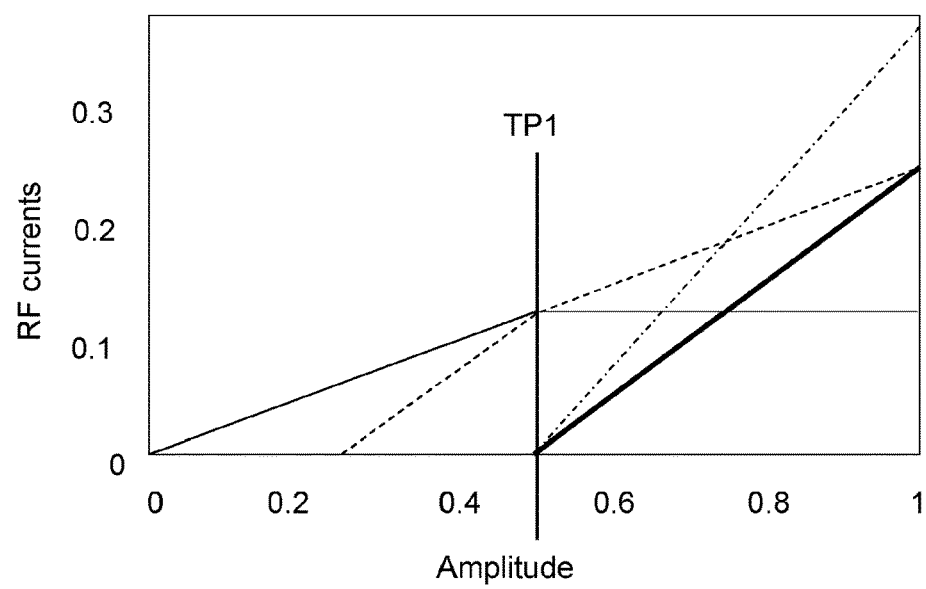
FIG. 3 is a diagram illustrating RF output currents as a function of amplitude of the input signal.

FIG. 3 shows RF output currents as a function of the input signal amplitude for the composite amplifier with 3 sets of sub-amplifiers according to embodiments shown in FIG. 2. The RF current from the first set 110 is shown as a solid line. The RF current from the second set 120 is shown as a dashed line. The RF current from a first sub-amplifier 131 of the third set 130 is shown as a dash-dotted line. The RF current from a second sub-amplifier 132 of the third set 130 is shown as a bold line. This formatting of lines has also been used in FIGS. 4-10. As shown in FIG. 2, the RF output currents for the second set 120 of sub-amplifiers continue to increase above the first transition point TP1.

Figure 4:
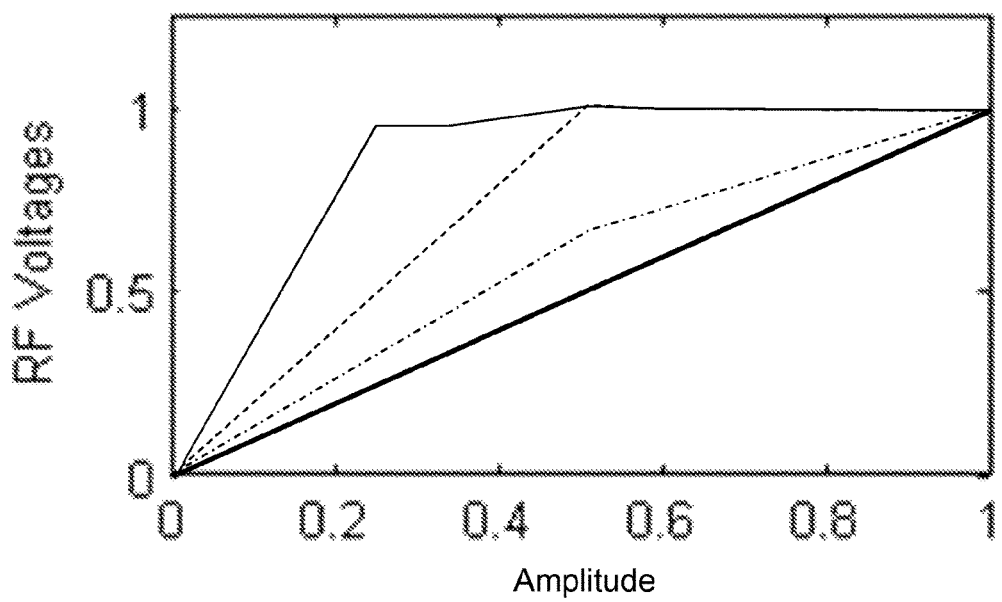
FIG. 4 is a diagram illustrating RF output voltages as a function of amplitude of the input signal.

FIG. 4 shows RF output voltages for the second set 120 of sub-amplifiers. The same formatting of lines has been used as in FIG. 3, i.e. RF voltage from the first set is shown as a solid line, etc.

Figure 5:
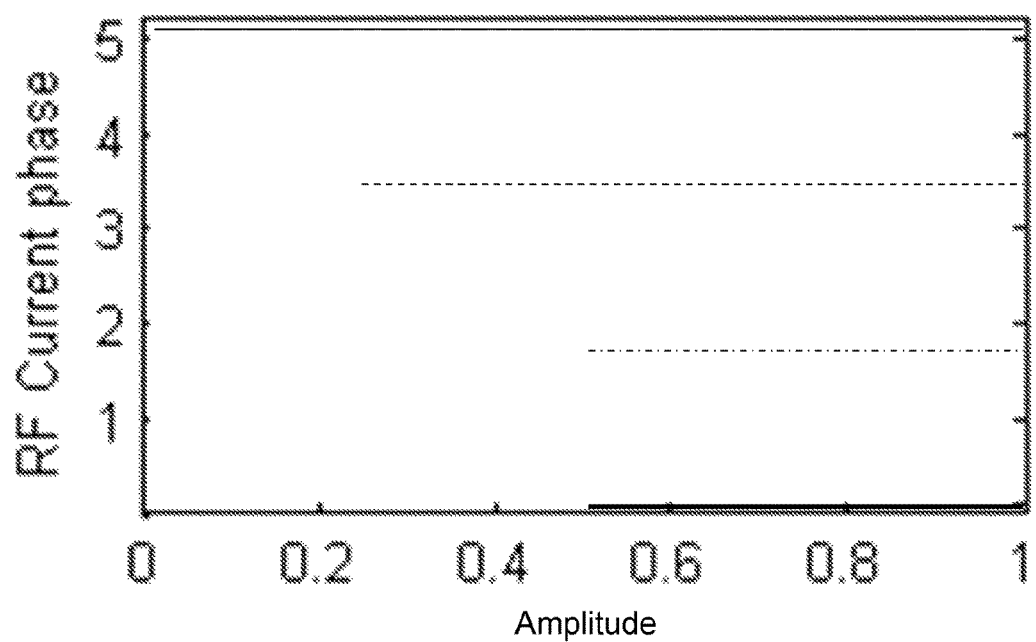
FIG. 5 is a diagram illustrating RF output current phase as a function of amplitude of the input signal.

FIG. 5 shows that RF output current phase is substantially constant for each of the sub-amplifiers over the amplitude range. The same formatting of lines has been used as in FIG. 3, i.e. RF current phase from the first set is shown as a solid line, etc.

Figure 6:
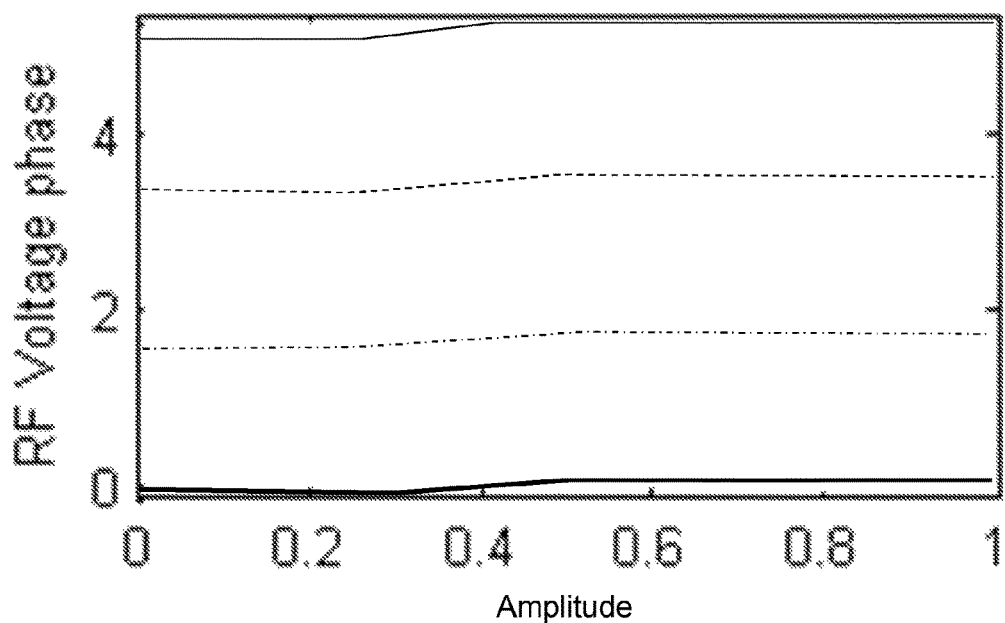
FIG. 6 is a diagram illustrating RF output voltage phase as a function of amplitude of the input signal.

FIG. 6 shows that RF output voltage phase varies only marginally over the amplitude range. The same formatting of lines has been used as in FIG. 3, i.e. RF voltage phase from the first set is shown as a solid line, etc.

Figure 7:
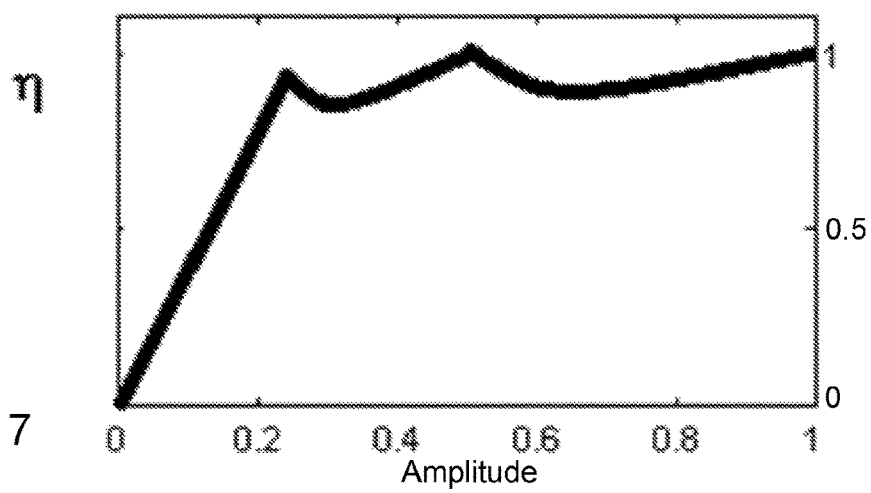
FIG. 7 illustrates a diagram in which efficiency as a function of amplitude of input signal is plotted.

The extra sub-amplifier and transformation step makes the working conditions for the first two sets of sub-amplifiers, i.e. the first set 110 and second set 120, much better. For these two sets of sub-amplifiers, the use of a weighting factor of about 0.5 for the RF output currents at the transition points relative to their value at the full output current, causes a linear response to the input signal up to a maximum output amplitude. This means that no extra transition point needs to be provided by the drive signal circuits. This is not the case for the second set 120 sub-amplifier which needs a transition point at 0.5 of the full input signal amplitude. The operation at 10% from the center frequency for this amplifier is shown in FIG. 7. FIG. 7 illustrates efficiency η as a function of the input signal amplitude. In this example, the efficiency is above about 87% relatively peak efficiency in back-off range of 1:4. The relative bandwidth is 20%.

Figure 8:
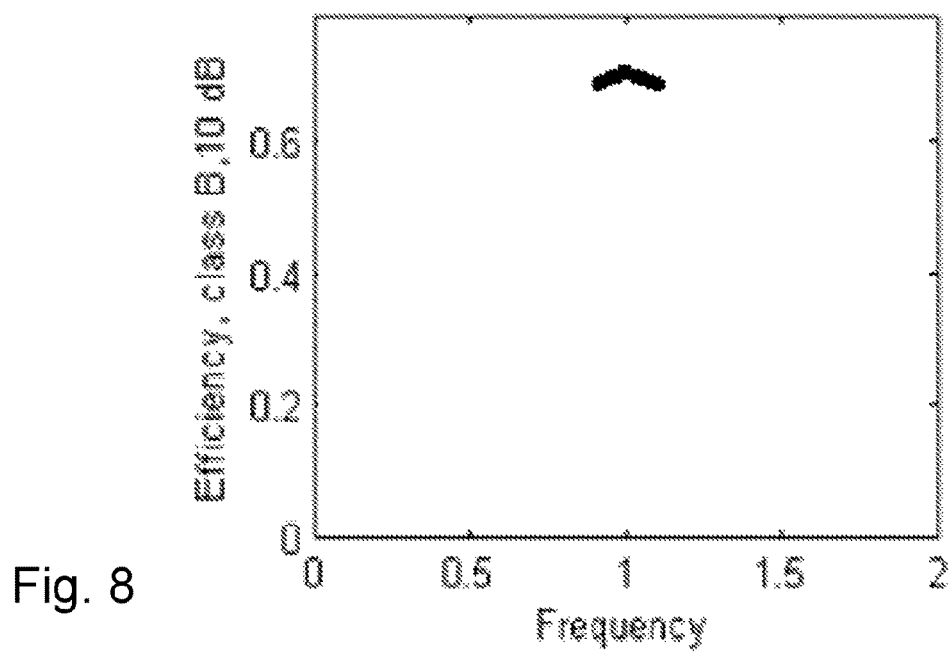
FIG. 8 illustrates a diagram in which efficiency as a function of frequency for the composite power amplifier of FIG. 2 is plotted.

As shown in FIG. 8, this amplifier work at high efficiency within 20% of the operational bandwidth. The efficiency is in a range from 65% to 70% for the 20% narrow band illustrated in FIG. 8.

Figure 9:
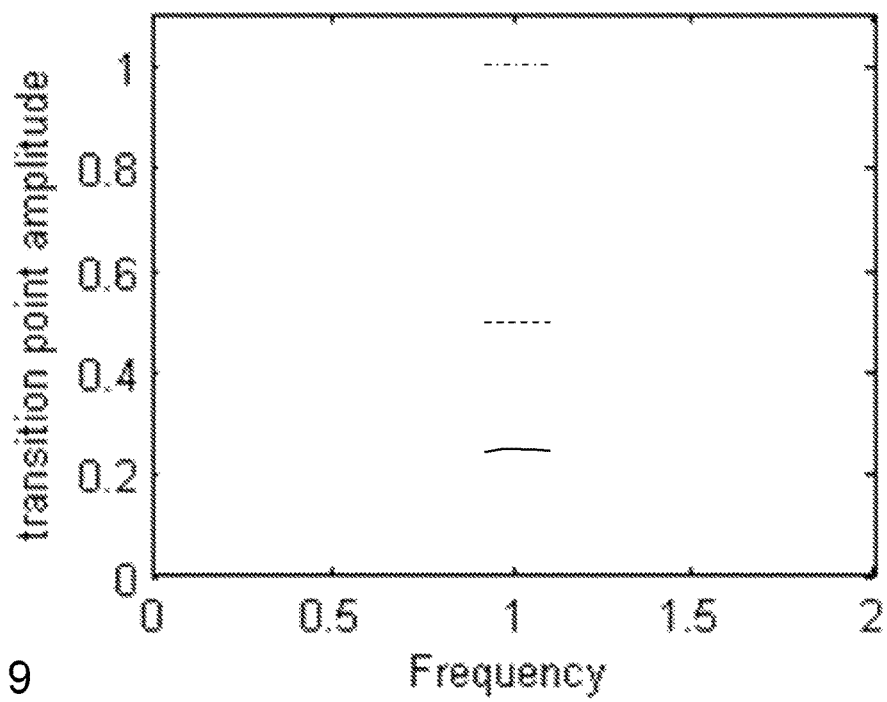
FIG. 9 illustrates transition point amplitude as a function of frequency.

FIG. 9 shows transition point amplitudes as a function of frequency for the composite power amplifier of FIG. 2. FIG. 9 shows that the input signal amplitude is substantially constant for each set of sub-amplifier over the operational bandwidth of 20%.

Figure 10:
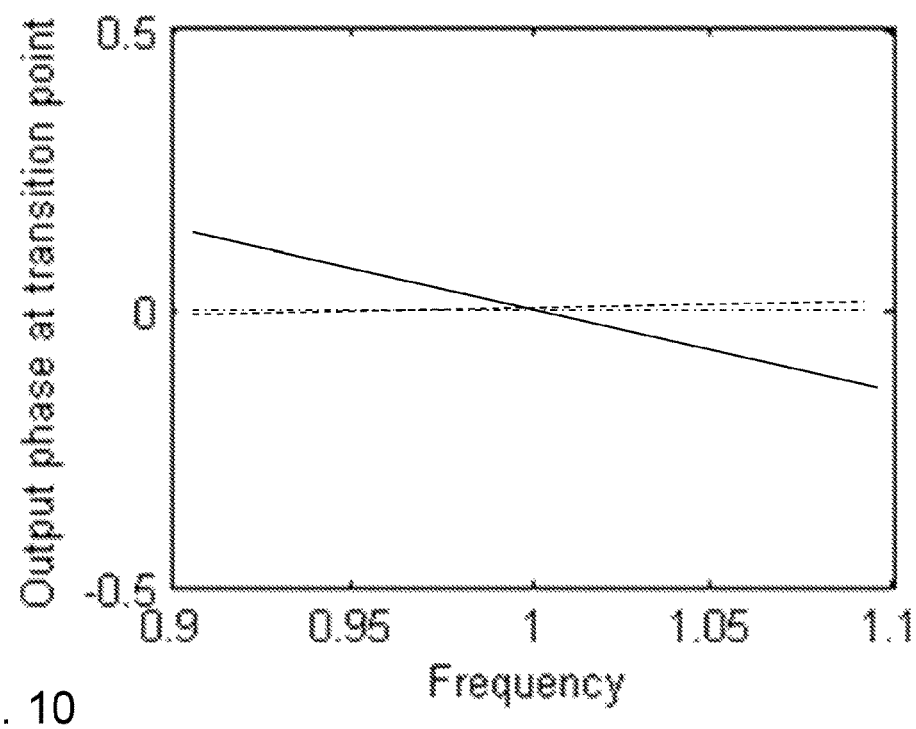
FIG. 10 illustrates output signal phase at transition point as a function of frequency.

FIG. 10 shows output signal phase at the transition point as a function of frequency. For certain sub-amplifiers the phase is almost constant.

Figure 11:
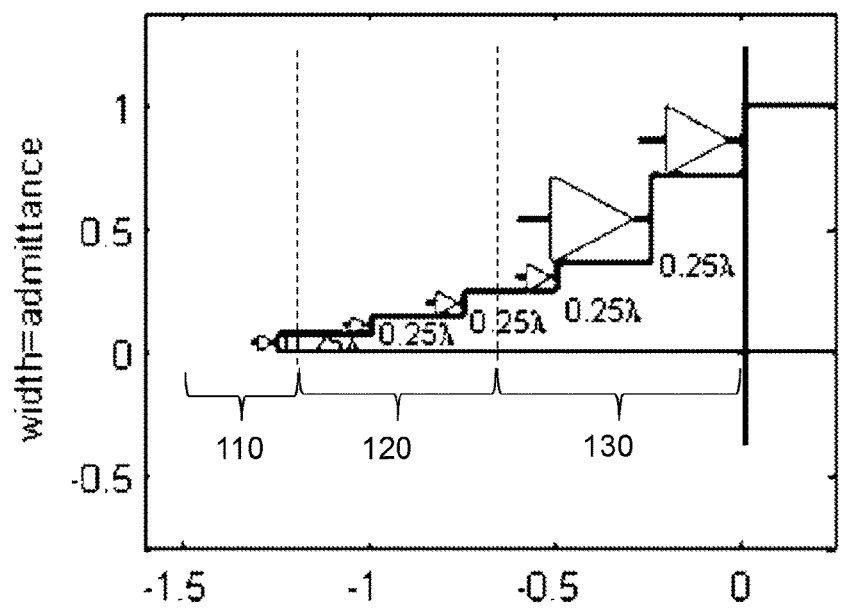
FIG. 11 illustrates tapering for a further exemplifying composite power amplifier.

In a further example, as shown in FIG. 11, the composite power amplifier 100 is configured to provide time delayed versions of the input signal collectively to the second set 120 of sub-amplifiers, similarly to as in the previous examples. The second set 120 of sub-amplifiers are arranged along the second tapered transmission line 152 to provide in-phase combing of the time delayed versions of the input signal.

In more detail, the composite power amplifier 100 has transition points at 0.25 and 0.5 of the full input signal amplitude, built with 1, 2 and 3 sub-amplifiers in the respective sets 110, 120 and 130. The bandwidth is 20%. For this bandwidth and low number of sub-amplifiers, it is not optimal to have the sets to deliver their full RF output current at their associated transition point. In this case, a weighting factor of about 0.9 for the RF output currents at the transition points relative to their value at the next transition point (and full output) has been used. For example, a weighting factor of about 0.9 is used for the second set 120 of sub-amplifiers at the second transition point 0.5, and a weighting factor of about 0.9 or 0.81 is used for the first set 110 of sub-amplifiers at the first transition point 0.25. The efficiency is about 98% as given by FIG. 12.

Figure 13:
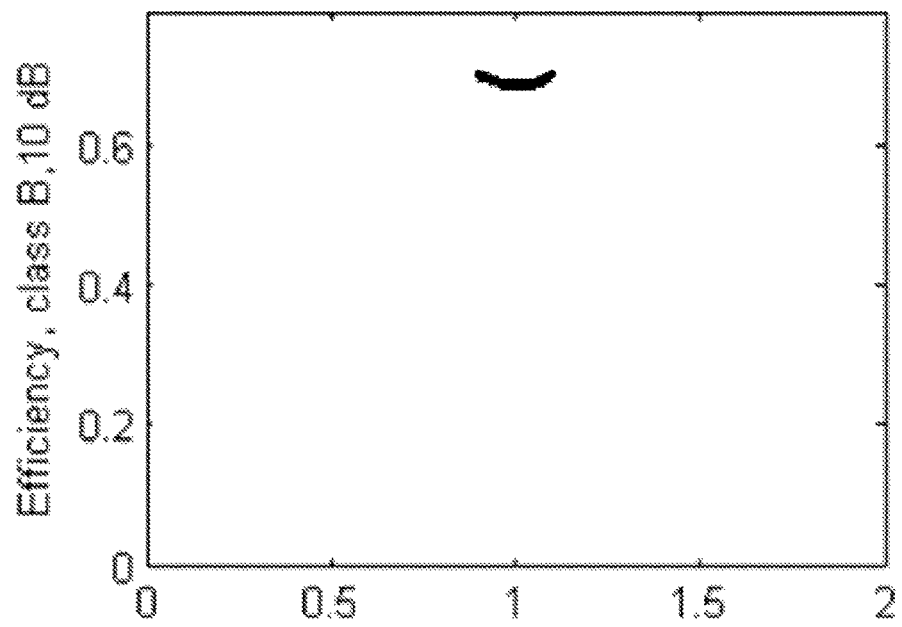
FIG. 13 illustrates a diagram in which efficiency as a function of frequency for the composite power amplifier of FIG. 11 is plotted.

FIG. 13 illustrates efficiency as a function of frequency for the composite power amplifier of FIG. 11. The efficiency is around 69% over a bandwidth of about 20% of the operational bandwidth.

Figure 14:
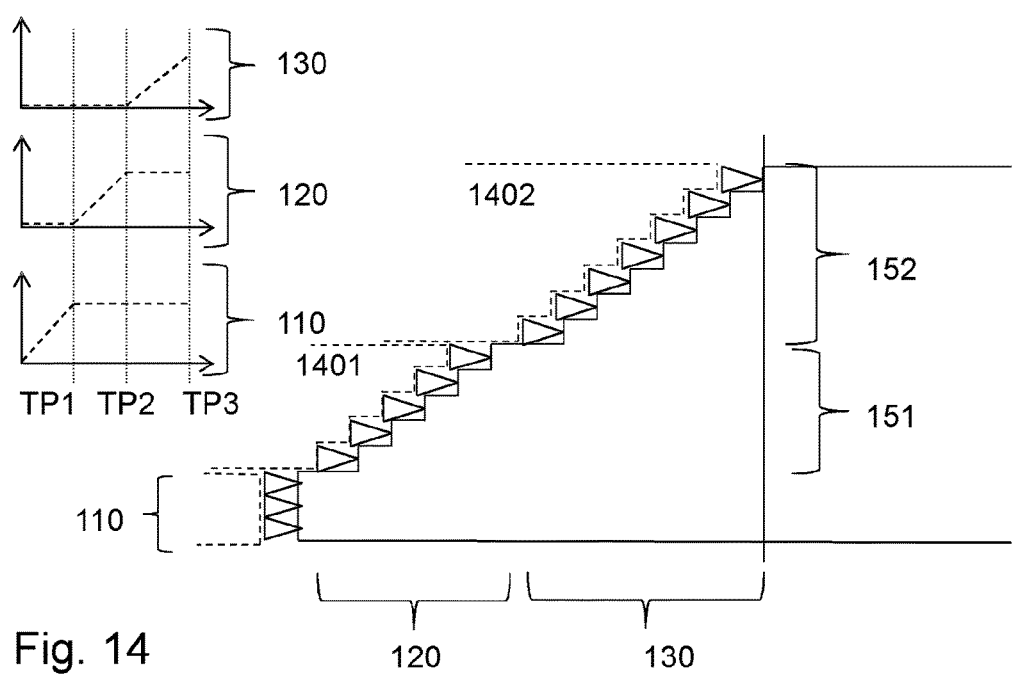
FIG. 14 illustrates tapering for a still further exemplifying composite power amplifier.

FIG. 14 depicts another embodiment of the composite power amplifier 100. The first, second and third sets 110, 120 and 130, are each associated with a transition point, i.e. a first transition point TP1, a second transition point TP2 and a third transition point TP3 as mentioned above. The sub-amplifiers of a set 110, 120, 130 are usually driven so that their output signals are combined in-phase at the transition point. For this to work, the rest of the transmission line may provide a good transformed load across the specified band or bands. The frequency response will then be flat, within some margin, at the junctions between the sets and the amplitude and phase response at the transition points will likewise be flat, again within some margin. The term "flat" shall be understood as compared to a pure delay. A phase response is usually referred to as being linear, or close to linear. Accordingly, the phase ripple becomes low in this context. Input signal amplitude diagrams for the sets of sub-amplifiers are shown in a left portion of FIG. 14. In these diagrams, voltages as a function of amplitude are plotted. For the first set 110, the voltage for the first set 110 ramps up to the first transition point TP1 and then the voltage becomes constant. For the second set 120, the voltage ramps up from the first transition point TP1 to the second transition point TP2, then the voltage continues at a constant value up to the third transition point TP3. For the third set 130 the voltage ramps up from the second transition point TP2 to the third transition point TP3.

In FIG. 14, to the right, tapered incoming transmission lines 1401, 1402, are illustrated with dotted lines, which matches the tapers of the respective transmission line 151, 152. The incoming transmission lines 1401 and 1402 are coupled to the inputs of respective the second and third sets 120, 130 of sub-amplifiers.

As shown in FIG. 14, the composite power amplifier 100 is configured to provide a first signal, e.g. with a proper time delay distribution, to the first set 110 of sub-amplifiers, wherein the first set 110 of sub-amplifiers are arranged in parallel and coupled to the first straight transmission line 151.

The sub-amplifiers in each set are driven collectively by input signals, i.e. with the same amplitude function, with proper time delay distribution given by their position along the incoming transmission lines. The set 110 includes 3 sub-amplifiers. The set 120 includes 5 sub-amplifiers. The set 130 includes 7 sub-amplifiers. In FIG. 14, each sub-amplifier is only schematically shown with a triangle symbol. The splitting of the input signals to the individual sub-amplifiers in a set can be made at different points and by different methods. Providing resistive input impedance at the sub-amplifiers that matches the admittance steps of drive line or transmission line with a decreasing admittance is one way. Splitting by, e.g. sufficiently broadband, dividers is another way that is in some cases preferable. The distributed amplifier technique of having the input capacitance of the transistors absorbed into a synthetic transmission line gives the best gain-bandwidth product. See for example, E. Ginzton et al., "Distributed Amplification", Proc. IRE, vol. 36, pp. 956-969, August 1948. The proper time delay distribution can be expressed as that the composite power amplifier 100 may be configured to match time delay distribution of the input signals, received by the first set 110 of sub-amplifiers, to the first transmission line 151 to obtain in-phase combing of the output signals, amplified by the first set 110 of sub-amplifiers, at the output port 180.

Furthermore, proper time delay distribution is achieved by that the composite power amplifier 100 may be configured to match time delay distribution of the input signals, received by the second set 120 of sub-amplifiers, to the second transmission line 152 to obtain in-phase combing of the output signals, amplified by the second set 120 of sub-amplifiers, at the output port 180.

Additionally, when applicable, proper time delay distribution is achieved by that the composite power amplifier 100 may be configured to match time delay distribution of the input signals, received by the third set 130 of sub-amplifiers, to the third transmission line 153 to obtain in-phase combining of the output signals, amplified by the third set 130 of sub-amplifiers, at the output port 180.

In many cases the first set 110 of sub-amplifiers only comprises of one sub-amplifier, and in other cases the first set of sub-amplifiers may comprise several sub-amplifiers in parallel. Having only one sub-amplifier in the first set 110 is often preferable for reasons of simplicity and compactness. However, by distributing also the first set 110 of sub-amplifiers, advantage on the gain-bandwidth product can be achieved also here.

It is often good enough to just provide "staggered timing" of the drive signals to all sub-amplifiers by the same amount as the travel time for the wave across all prior transmission line sections. This is because the wideband phase and amplitude response difference between the transforming mode and the in-phase mode for these sub-amplifiers is often very small. This difference can also be arbitrarily reduced.

The operation of these sub-amplifiers may thus be seen as interpolations between successive transforming modes and a final non-transforming mode. At amplitudes below the lowest transition point, there can be observed a transforming in-phase mode for the first set 110 of sub-amplifiers, i.e. in-phase combination of the output signals from the first set 110 of sub-amplifier, but to the local impedance level at the "end" of the first set 110 of sub-amplifiers. At the next transition point, another transforming in-phase mode is obtained, this time with all sub-amplifiers in the first two sets 110, 120 and to a lower impedance level, e.g. to a local impedance level at the "end" of the second set 120 of sub-amplifiers. Between these transition points, there is a varying degree of linear interpolation between the two described modes. This pattern is repeated (amplitude-wise) for all sub-amplifier sets 110, 120, 130 up to the in-phase combination of all sub-amplifiers to the full output power.

Figure 15:
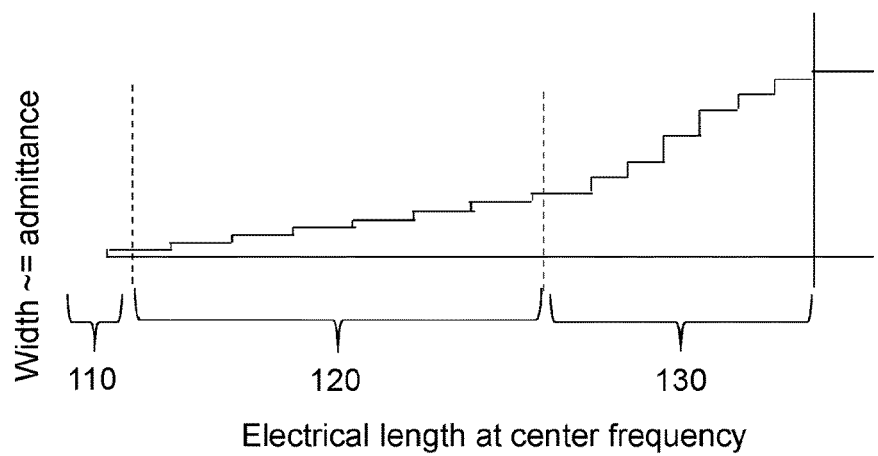
FIG. 15 illustrates tapering for another exemplifying composite power amplifier.

FIG. 15 illustrates a further embodiment of the composite power amplifier according to embodiments herein. The illustrated composite amplifier 100 is a 15-stage amplifier designed for a 4:1 bandwidth, i.e. a frequency range of 0.4 to 1.6 of the center frequency, or 120% of the operational bandwidth. The sub-amplifiers are grouped so that one sub-amplifier alone functions as the first set 110, whereas the two subsequent sets 120, 130, each comprises 7 sub-amplifiers. The sub-amplifiers are placed at transmission line segments of different characteristic impedance. In this case, all segments are the same length, i.e. a quarter wavelength at the center frequency. At the lowest frequency, 0.4 times the center frequency, they are 0.1 wavelengths each, which gives a total electrical length of 1.4 wavelengths at the center frequency. The second half, i.e. the third set 130 of sub-amplifiers, of the transmission line transforms a load, at the output port 180, up about 4 times, resulting in an upper transition point at 0.5 (−6 dB) of the full output amplitude. The first half, i.e. the second set 120 of sub-amplifiers, transforms that impedance a further 4 times, resulting in about 16 times the load resistance and a lower transition point of 0.25 (−12 dB) of the full output amplitude.

Figure 16:
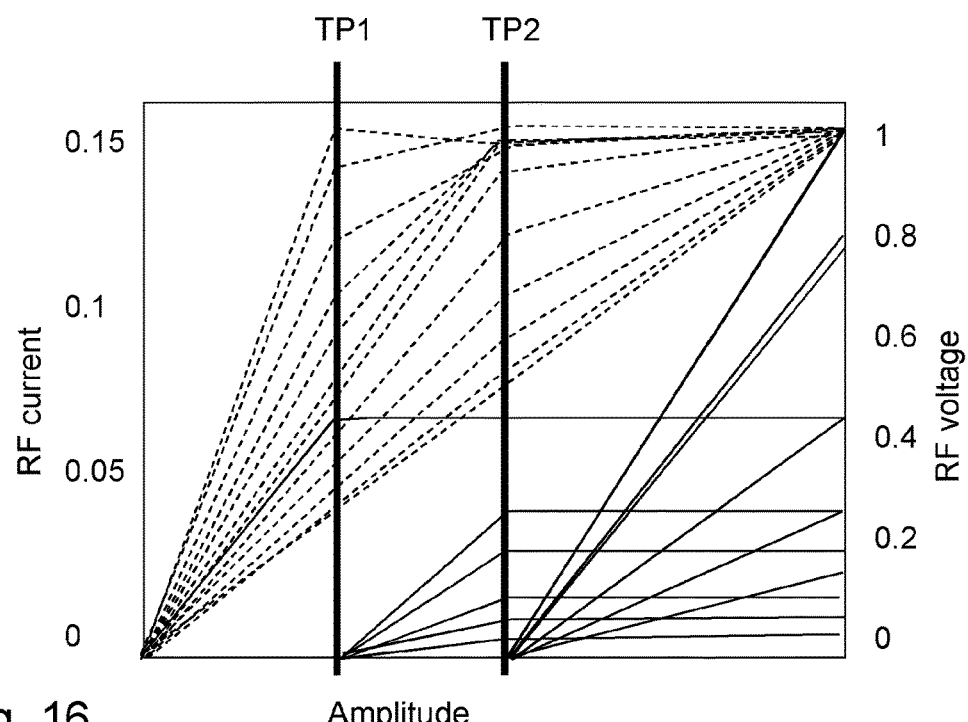
FIG. 16 illustrates a diagram in which RF output current/voltage as a function of input signal amplitude is plotted.

Now turning to FIG. 16, a diagram illustrating RF output currents as solid line and RF output voltages as dashed-lines is shown. Maximum RF output currents of all sub-amplifiers are proportional to the admittance step of the junction between transmission lines at which they are situated. The sub-amplifiers are driven by input signals with the same relative phase at all amplitudes, wherein the relative phase is given only by the timing difference along the transmission line.

The non-ideality resulting from this can be made arbitrarily small through increasing the number of steps in the respective transmission lines, or by having different phases for the sub-amplifier sets 110, 120, 130 at the different transition points TP1, TP2. The output voltages at the different sub-amplifiers are different mixtures, e.g. multi-plexing, of the current shapes of the lower and upper groups. The output voltages at the intermediate sub-amplifiers are often not necessary to optimize for, but the voltage "shapes" at the last sub-amplifier in a set should preferably be close to constant over frequency in amplitude and phase for simplicity of control. This is achieved through having a good taper, i.e. a sequence of admittance steps, of the transmission line for each section. A good taper usually has smaller admittance steps around the first and last sub-amplifier in a set, which is also seen in FIG. 15. The sub-amplifiers should also preferably avoid to be too hard compression. By "overdesigning", i.e. having a larger number of admittance steps for each set, the drive conditions can be simplified to the point of allowing constant maximum drive with constant timing for all sub-amplifiers in a set above its associated transition point. This is to a high degree the case for this example.

Figure 17:
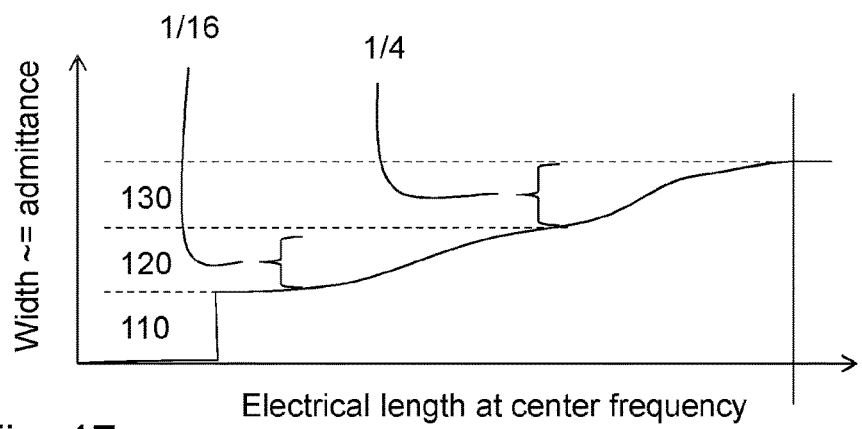
FIG. 17 illustrates tapering for a further exemplifying composite power amplifier.

FIG. 17 illustrates an exemplifying composite power amplifier 100 with sub-amplifiers of equal size, i.e. with same RF output current. If the number of sub-amplifiers of equal size is also large, the distances between them may be small, and generally unequal, and the transmission line taper can be seen as continuous, schematically illustrated as a continuous line in FIG. 17. In this example, there are 256 sub-amplifiers. The 256 sub-amplifiers are arranged in sets of 16, 48 and 192. The first 16 sub-amplifiers are all in parallel as part of the first set 110 of sub-amplifiers. The sets of 48 and 192 amplifiers are spread out according to local admittance increase along equal lengths of tapered transmission line. Thus, the 48 sub-amplifier form the second set 120 and the 192 sub-amplifiers form the third set 130. Both the second and third sets 120, 130 have about 4 times load transformation, resulting in the same local impedances for the sets and the same transition point amplitudes as in the previous example. The bandwidth is also the same, i.e. 4:1, as in the previous example.

The width of outgoing transmission line is only schematically shown. In a real implementation, for example, the widths of the second and third transmission line should be ¹⁄₁₆ and ¼ of a total width of the outgoing transmission line.

Figure 18:
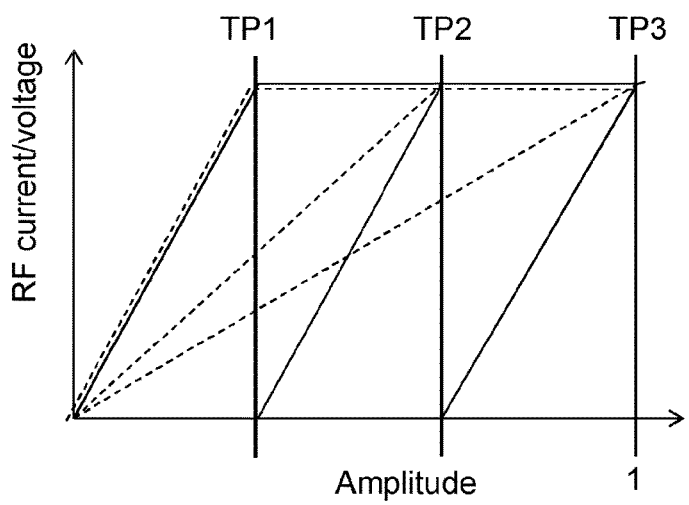
FIG. 18 illustrates a diagram in which RF output current/voltage as a function of amplitude of input signal is plotted.

Furthermore, FIG. 18 illustrates RF output current/voltage as a function of amplitude of input signal for the exemplifying composite power amplifier according to FIG. 17.

FIG. 18 illustrates how the RF output current, solid lines, and RF output voltage, dashed-lines, have the same transition points, TP1, TP2 and TP3. For simplicity, only three RF voltages, i.e. one from each of the first, second and third sets 110, 120, 130 of sub-amplifiers are shown. While comparing the composite power amplifier of FIG. 17 and the composite power amplifier of FIG. 15, it can be understood that if each output voltage/current for each sub-amplifier of the composite power amplifier of FIG. 17 is shown, it would render huge amounts of lines and not provide any information. FIG. 18 is thus a simplification, as mentioned above.

The RF output voltages shown are those of the last sub-amplifier of each set. The output voltage for a last sub-amplifier within a set includes a larger proportion of the latest applied current shape as input signal. The slope of the output voltage becomes steeper and steeper within the set, until it is substantially linear up to the subsequent transition point for the last sub-amplifier.

Figure 19:
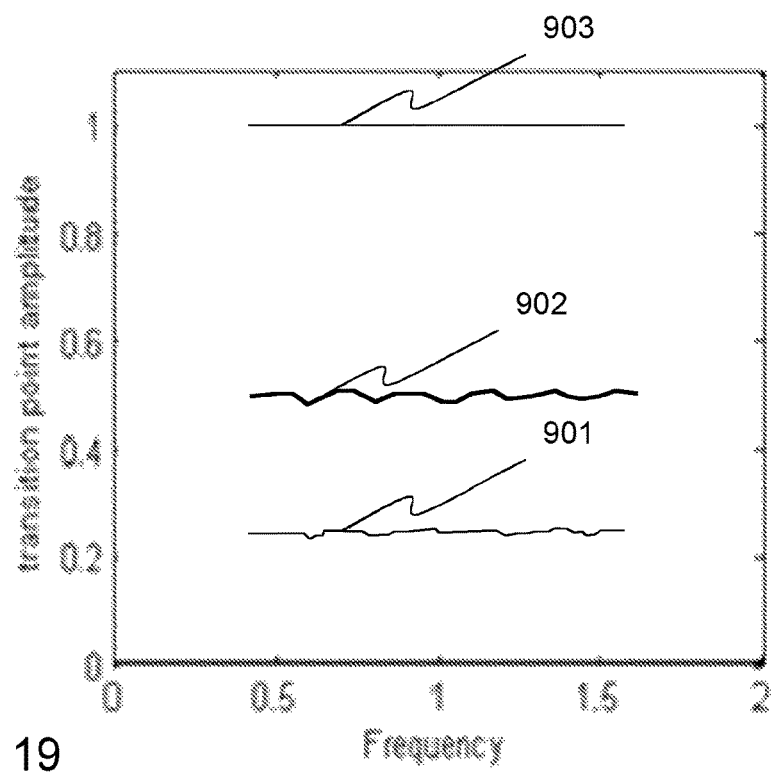
FIG. 19 illustrates transition point amplitude as a function of frequency.
Figure 20:
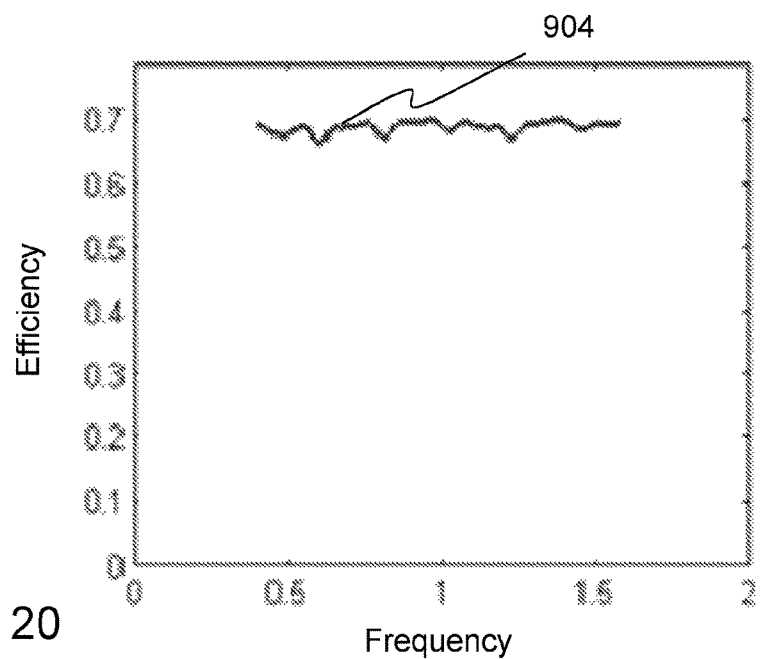
FIG. 20 illustrates efficiency as a function of frequency.

In FIG. 19, ripple in output signal amplitude at the transition points across the frequency range, given constant amplitude/phase driving, is shown for the composite power amplifier of FIG. 17. As can be seen, there is very little ripple in the transition point amplitudes. Each set is associated with two corresponding transition points, but the amplitudes depend on the sets already activated as well. A line 901 is the transition point amplitude corresponding to the full use of the first set 110, a line 902 is a transition point amplitude corresponding the full use of the first and second sets 110, 120 and a line 903 is a transition point amplitude corresponding to the full use of the first, second and third sets 110, 120, 130. FIG. 20 shows average efficiency over frequency range when amplifying a 10-dB Rayleigh-distributed signal. Efficiency is slightly below 70%, as shown by line 904, for an ideal class B operation of the composite power amplifier of FIG. 17.

While some of the examples above use large amounts of sub-amplifiers, some further examples below will have somewhat fewer sub-amplifiers, similarly to the initial examples.

Figure 21:
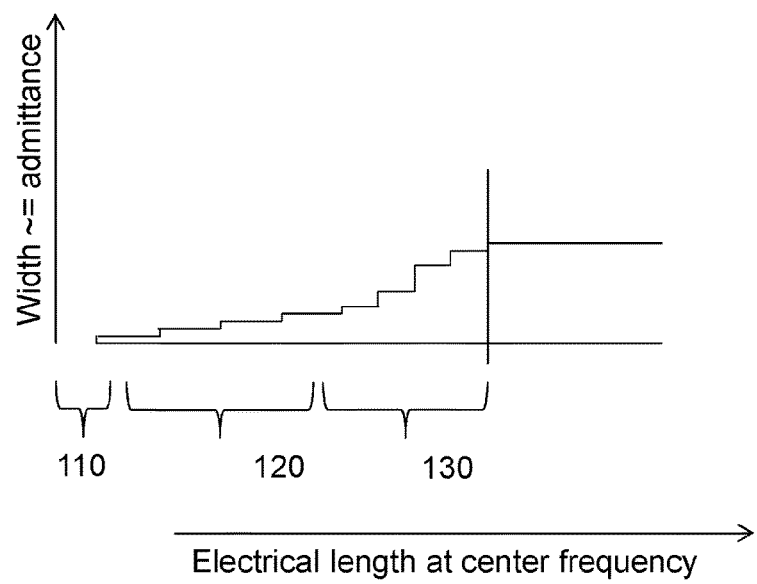
FIG. 21 illustrates a still other exemplifying composite power amplifier.

For lower bandwidths, the number of transmission line segments may be reduced, and thus also the number of sub-amplifiers. For continuous taper transmission lines the total length can be reduced. In the following example, as shown in FIG. 21, there are 9 sub-amplifiers (not shown at the steps for simplicity), in sets of 1, 3 and 5 sub-amplifiers. The lowest transition point (not shown) is at about 0.25 and the other (also not shown) is at about 0.47 of the full output amplitude. The bandwidth is here just 50%, i.e. 0.75 to 1.25 of the center frequency.

Figure 22:
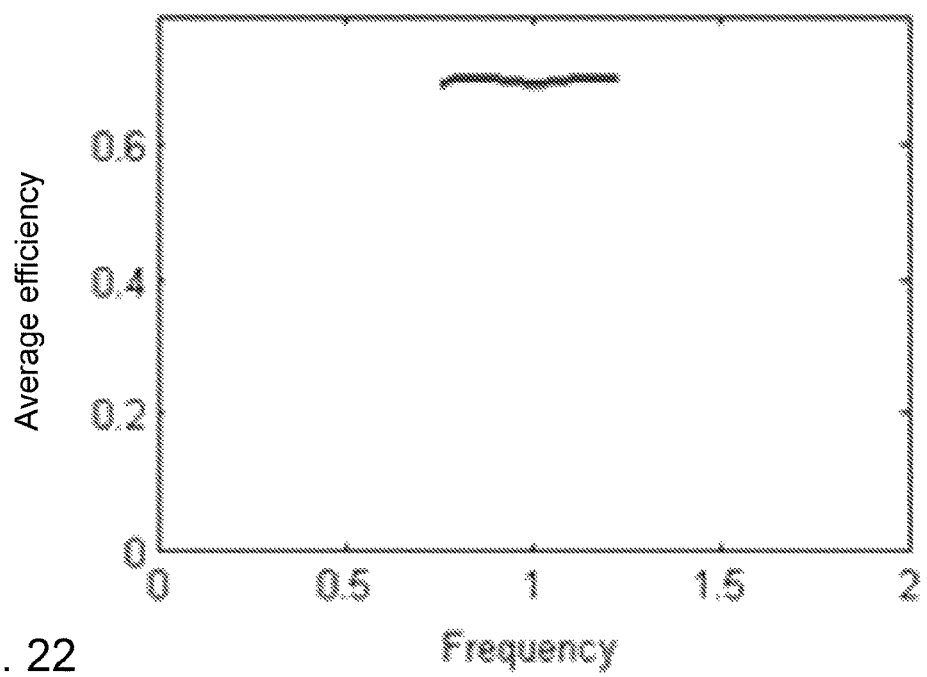
FIG. 22 is a diagram illustrating efficiency as a function of frequency.

With reference to FIG. 22, average efficiency over frequency range for an exemplifying composite power amplifier 100 is shown, where the composite power amplifier 100 comprises 1, 2 and 4 sub-amplifiers in the first, second and third sets 110, 120, 130, respectively, and the bandwidth is 50% of the operational bandwidth.

Figure 23:
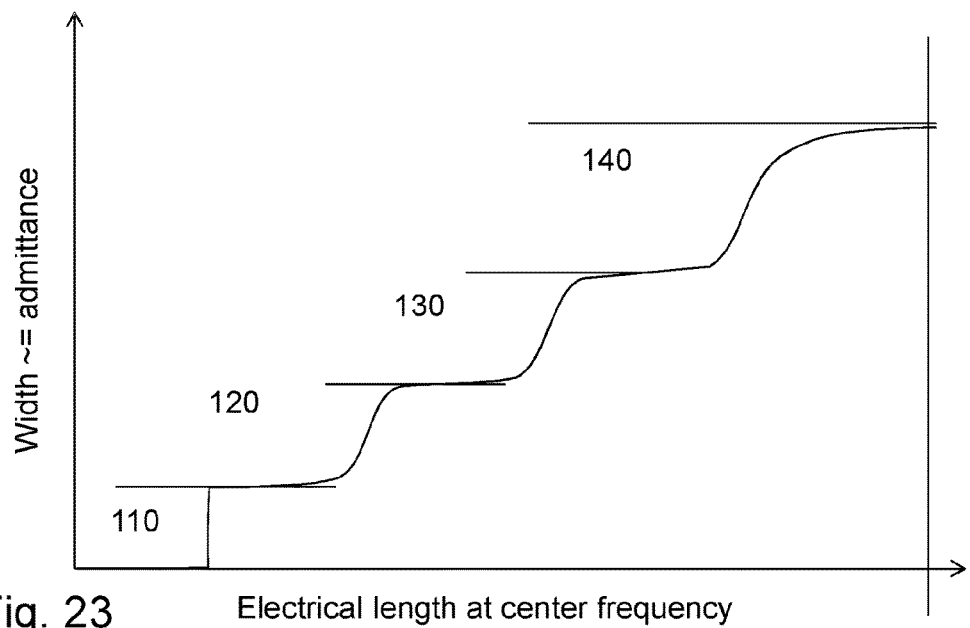
FIG. 23 is an illustration of tapered transmission lines according to some embodiments herein.

FIG. 23 illustrates embodiments with further sets of sub-amplifiers, i.e. a fourth set 140 of sub-amplifiers is added. In FIG. 23, the same reference numerals as in FIG. 1 have been used for the first, second, third and fourth sets 110, 120, 130, 140 of sub-amplifiers. In this Figure, the sub-amplifiers and shape of taper, i.e. steps, have not been shown for sake of simplicity.

Thus, as mentioned above, the composite power amplifier 100 may comprise a fourth set 140 of sub-amplifiers. The composite power amplifier 100 may then be configured to provide time delayed versions of a fourth signal, derived from the input signal, collectively to the fourth set 140 of sub-amplifiers. The fourth set 140 of sub-amplifiers may be arranged along a fourth tapered transmission line 154 to provide in-phase combing of the time delayed versions of the fourth signal amplified by the sub-amplifiers in the fourth set 140.

This implies that the embodiment is expanded to even more transition points, i.e. greater than two. The transition points are evenly distributed in logarithmic scale, at 0.5, 0.25 and 0.125 of the full output signal amplitude (−6, −12 and −18 dB). A single sub-amplifier constitutes the first set 110. The three last sets 120, 130, 140 contain 7 sub-amplifiers each, and are essentially just scaled versions of each other. The scaling is a factor of four per set, so that the first set 110 provides 1/64 of the full output power, the two first sets 110, 120 together provide 1/16, and the first three sets 110, 120, 130 together provide ¼. The admittance tapering, i.e. the steps of the transmission line(s), is similar to that of the previous examples, with large admittance steps in the middle of each transmission line and small steps at beginning and end of each transmission line for a respective set.

Figure 24:
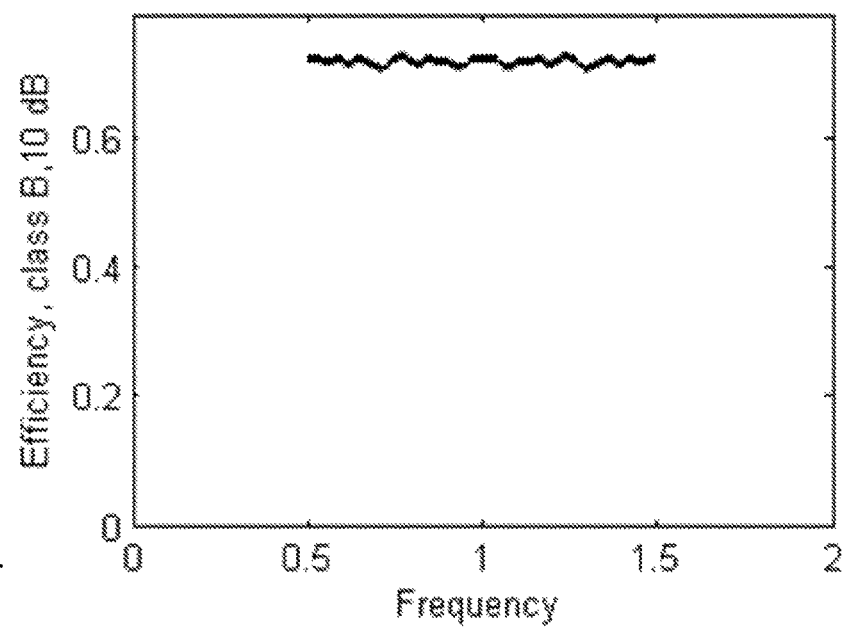
FIG. 24 is a diagram illustrating efficiency as a function of frequency.

FIG. 24 shows that efficiency is about 74-75% for the 22-stage composite power amplifier, assuming ideal class B amplifiers, described above with reference to FIG. 23.

Above it has been shown that it is possible to form multiple peaking amplifier sets that have all important properties at the transition points essentially constant in a wide band. Therefore it may also be possible to split up and distribute a first (main) sub-amplifier. The composite power amplifier's first set 110 is then driven collectively without using the single-amplifier mode. This enables the distributed amplifier input drive techniques described previously to be used for all sets 110, 120, 130 which improves high frequency operation by absorbing transistor input capacitance into a synthetic transmission line. See for example E. Ginzton et al., "Distributed Amplification", Proc. IRE, vol. 36, pp. 956-969, August 1948.

Figure 25:
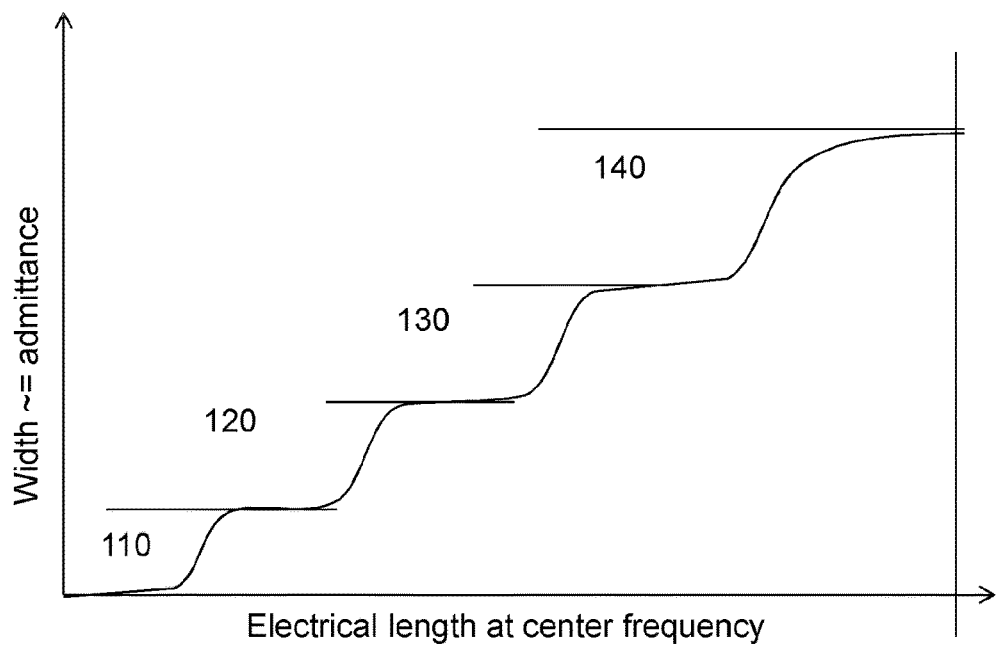
FIG. 25 is yet another illustration of a tapered transmission line according to embodiments herein.

FIG. 25 illustrates one such exemplifying composite power amplifier in which the first set 110 comprises a tapered transmission line with multiple sub-amplifiers (tapering is schematically shown by continuous lines and sub-amplifiers are not shown). In this example, there are 8 sub-amplifiers in the first set 110. These have the same drive signal shape. Moreover, these sub-amplifiers may have the same size and admittance step size of its corresponding transmission line and may be spread evenly along a transmission line with total length of a half wavelength at center frequency. In more detail, this means that the composite power amplifier 100 may be configured to provide time delayed versions of the first signal collectively to the first set 110 of sub-amplifiers, wherein the first set 110 of sub-amplifiers are arranged along a first tapered transmission line 151 to provide in-phase combing of the time delayed versions of the first signal amplified by the sub-amplifiers in the first set 110.

The amplifier operates very similarly to the composite amplifier of FIG. 15 except that it now only has transition points at 0.25 and 0.5 of the full output amplitude. The efficiency at −18 dB is halved, i.e. halfway between an efficiency peak at 0.25 and zero (at which the efficiency is also zero).

Figure 26:
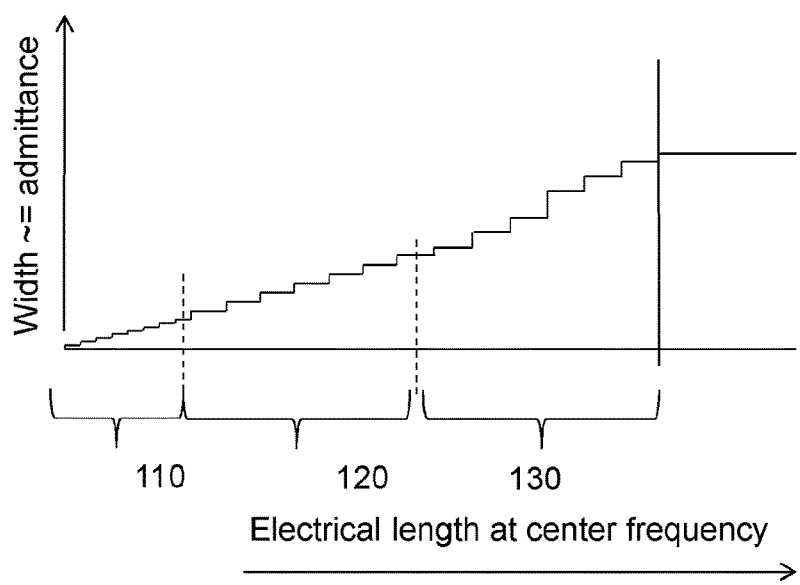
FIG. 26 is an illustration of tapering of transmission line for one embodiment herein.

FIG. 26 illustrates a further example of a composite power amplifier with a tapered first transmission line. This example is similar to that of FIG. 25, but here there are only three sets 110, 120, 130 of sub-amplifiers. The steps and number of steps is only schematically shown in FIG. 26.

Figure 27:
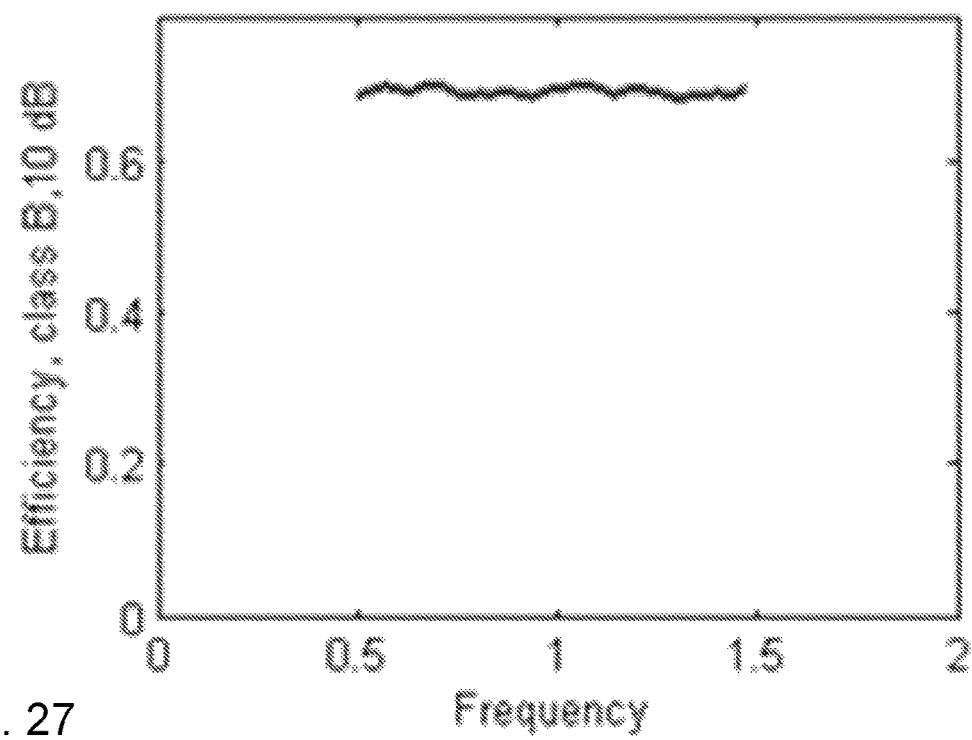
FIG. 27 is a diagram illustrating efficiency as a function of frequency.

In FIG. 27 efficiency for the exemplifying composite power amplifier according to FIG. 25 is shown. The efficiency for a 10 dB Rayleigh distributed signal is about 70%.

When "fully transformed" sets are cascaded, all sub-amplifiers in each set output their maximum RF currents and voltages at the associated upper transition point. In other words they have almost exactly the same working conditions at the transition point as at the full output amplitude or power. Yet another way to express this is that they have very little residual load modulation above the transition point.

Figure 28:
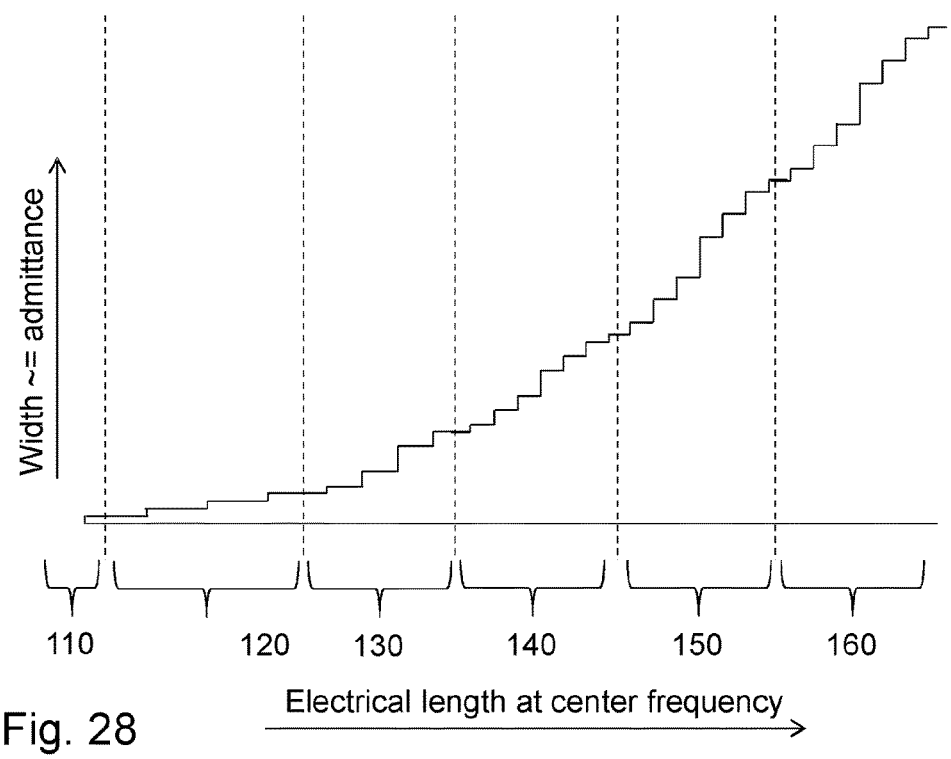
FIG. 28 is another illustration of tapering transmission line according to some embodiments herein.

With reference to FIG. 28, a five transition point composite power amplifier 100 is shown. This means that the composite power amplifier 100 comprises five sets of sub-amplifiers. With the five transition point amplifier the transition points are located at 0.21, 0.27, 0.35, 0.46, and 0.59, relative to the maximum output amplitude of 1. The operational bandwidth is 2:1. The composite power amplifier 100 comprises 22 sub-amplifiers, forming set 110 comprising 1 sub-amplifier, sets 120, 130, 140 and 150, each comprising 4 sub-amplifiers and set 160 comprising 5 sub-amplifiers. The number of sub-amplifiers per set can be relatively low since the transition points are relatively close to each other. The sum of RF output current amplitudes from all included sets at a transition point is proportional to the transition point amplitude squared, and the transformed impedance from the rest of the transmission line towards the output is proportional to the inverse of the transition point amplitude squared. This is generally the case for these amplifiers when fully transformed sets are used.

Figure 29:
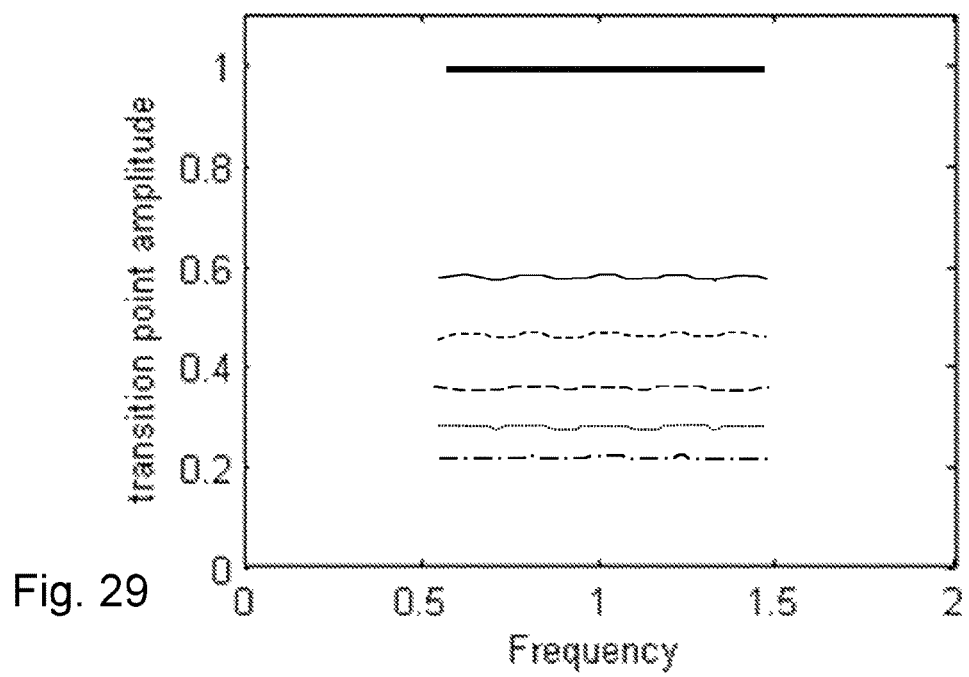
FIG. 29 is a further diagram illustrating transition point amplitudes as a function of frequency.

FIG. 29 shows transition point amplitudes for the exemplifying composite power amplifier directly above. The dash-dotted line corresponds to a transition point amplitude for the first set of sub-amplifiers, i.e. the maximum output signal amplitude obtained by the first set. The small-dotted line corresponds to a transition point amplitude for the first and second sets of sub-amplifiers, i.e. the maximum output signal amplitude obtained by the first and second sets. The long-dashed line corresponds to a transition point amplitude for the first, second and third sets of sub-amplifiers, i.e. the maximum output signal amplitude obtained by the first, second and third sets of sub-amplifiers. The dashed line corresponds to a transition point amplitude for the fourth set of sub-amplifiers, i.e. the maximum output signal amplitude obtained by the first, second, third and fourth sets of sub-amplifiers. The thin solid line corresponds to a transition point amplitude for the fifth set of sub-amplifiers, i.e. the maximum output signals amplitude obtained by the first, second, third, fourth and fifth sets of sub-amplifiers. The thick line corresponds to a transition point amplitude for the sixth set of sub-amplifiers, i.e. the maximum output signal amplitude obtained by the first, second, third, fourth, fifth and sixth sets of sub-amplifiers.

Figure 30:
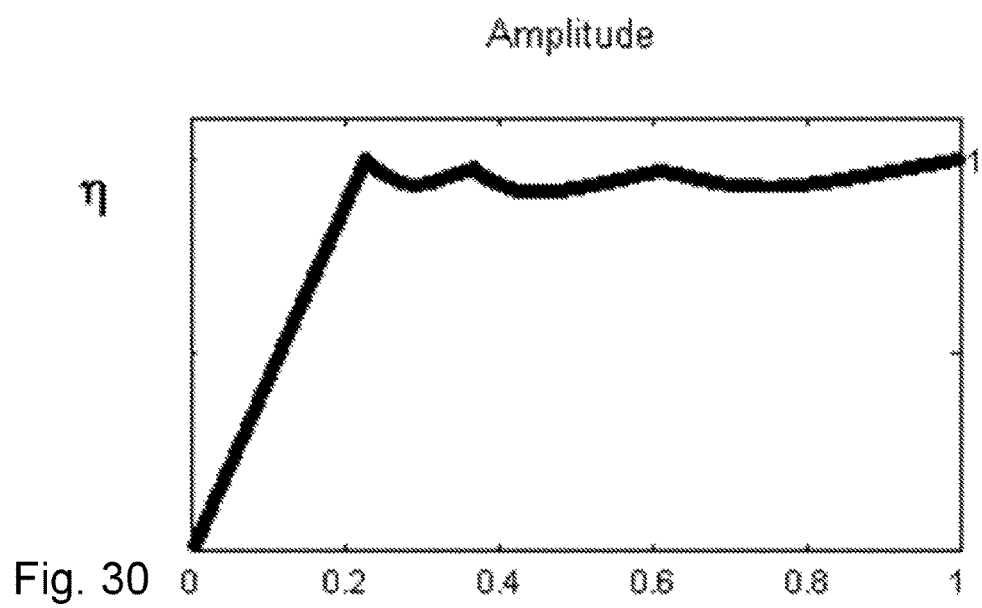
FIG. 30 is another diagram illustrating efficiency as a function of input signal amplitude.
Figure 31:
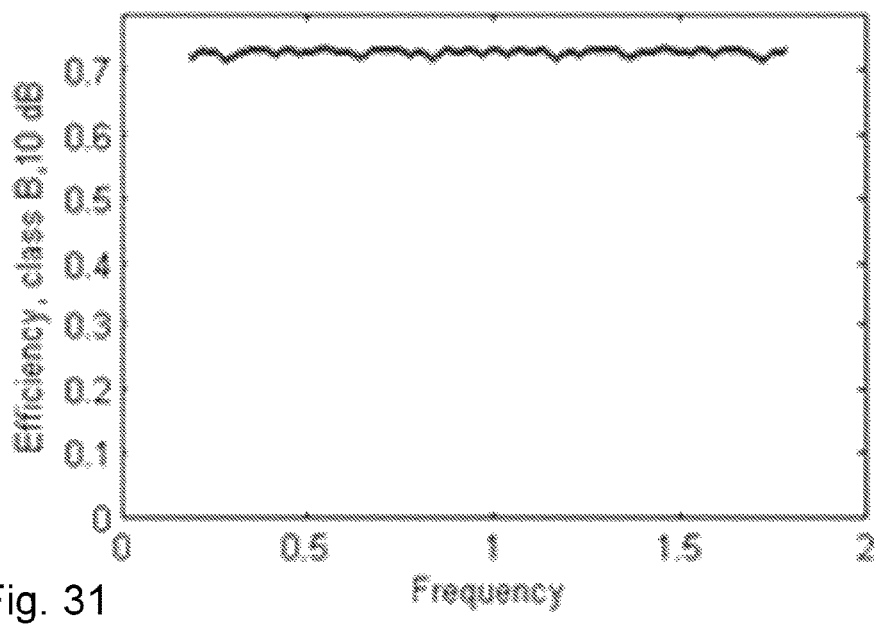
FIG. 31 is a diagram illustrating efficiency as a function of frequency.

In further embodiments, very wideband operation of the composite power amplifier is also possible. FIG. 30 illustrates efficiency as a function of input signal amplitude, at a frequency within the band, for a composite power amplifier with 10:1 bandwidth and three transition points, at 0.22, 0.36 and 0.6 of the full output amplitude. A single sub-amplifier is used for the first group, and 18 sub-amplifiers are used for each of the other three sets. FIG. 31 illustrates that the efficiency is substantially constant over the operational bandwidth of the composite power amplifier.

Figure 32:
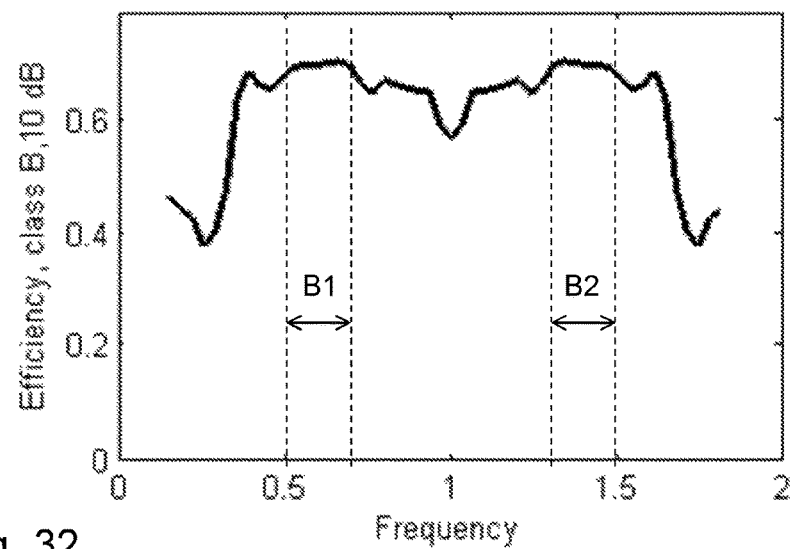
FIG. 32 is another diagram illustrating efficiency as a function of frequency.

Instead of merely tuning for one wide band, the composite power amplifiers can also be designed for operation in several narrower bands. An example of this is shown in FIG. 32. In this example, there are two bands, a first band B1 from 0.5 to 0.7, and a second band B2 from 1.3 to 1.5 of the "center frequency". FIG. 32 illustrates that efficiency is good for these two bands.

Keeping the total length of transmission line, or equivalent circuits, short is generally good since there is always a loss per unit length of transmission line. On the other hand, longer taper and more sub-amplifiers give lower ripple in the output signal over wider bandwidths. The best shape, or almost best, shortest for a given performance, of the tapered transmission line or stepped-impedance line is to have small admittance increase per unit length around the first and last amplifier in a set and steeper or larger change in the middle, as seen in most examples above. Using a linear taper or equidistant equal-size admittance steps is sub-optimal from this perspective, but is of course possible. An exception is that a relatively short linear taper transmission line is used for a distributed first set of sub-amplifiers, as seen in an example above.

The transistor sizes are usually secondary to its impedance profile when designing these amplifiers. The transistors in the sub-amplifiers should be large enough to deliver the required maximum RF output currents. A too large transistor is not a problem as long as its parasitics are absorbed or compensated correctly. A too small transistor can cause excess ripple in addition to lowered output power.

For the taper selection and selection of multi-section transformers, R. W. Klopfenstein in "A transmission line taper of improved design," Proc. IRE, vol. 44, pp. 31-35; January, 1956, and R. E. Collin in "The theory and design of wide-band multi-section quarter-wave transformers," Proc. IRE, vol. 43, pp. 179-185; February, 1955, teaches how to minimize reflection coefficient within a specified bandwidth for a single transformer with a perfect load.

Since tapered transmission lines according to embodiments herein have segments and act as multiple transformers, the inevitable reflection from one will make a less than perfect load for the next. This means that the abovementioned single transformers are not necessarily optimal when cascaded in this fashion. If the reflection is, i.e. designed to be, low enough, the error propagation is also low, and they can still be close to optimal also for this application. Generally there is however a benefit from co-optimizing the sets, so that they compensate for the imperfect load. Further aspects to the design of taper or admittance steps which are absent from the previous art is control of output voltage ripple at individual transistors and deliberate overdesign to allow for simpler drive signals and their distribution. Voltage ripple over frequency range may give rise to voltage undershoot in some frequency regions, which reduces efficiency, or voltage overshoot, which may saturate transistors and give rise to output nonlinearity.

Preferably, the frequency response for the output voltage of the sub-amplifiers at other points along the transmission line than the end of the sets is limited in magnitude so that the sub-amplifiers are not driven too far into saturation. The weighting factors can be adjusted to help fulfil this requirement. The amplifier can also be overdesigned compared to the minimum passable design, i.e. having longer taper with smaller admittance increase per unit length, and more and smaller sub-amplifiers, to allow for unity weighting factors to simplify drive signal generation.

Parasitic reactances at the output of the transistors can be handled in many ways. Pure capacitance at the transistor output node can usually be absorbed into the cascade of transmission lines, making "synthetic" transmission lines of this capacitance and a shorter transmission line of higher impedance (alternatively using only series inductance). Lead inductance can be cancelled by using negative mutual inductance between series inductances in an artificial (or synthetic) transmission line, see E. Ginzton et al., "Distributed Amplification", Proc. IRE, vol. 36, pp. 956-969, August 1948. Generally, high frequency operation calls for mostly synthetic transmission lines. i.e. most of the capacitance of the transmission line provided by the transistor capacitance and/or many transistors.

Composite power amplifiers according to the embodiments herein are relatively insensitive to shunt loss at the outputs of the transistors. They are usually better than multistage Doherty amplifiers in this respect. Since these amplifiers can be made to work uniformly across the whole bandwidth, the sensitivity to these losses can then also be nearly uniform across the whole bandwidth.

The high efficiency of the embodiments may be obtained if high-efficiency operating mode are used, for example class B, C or F operations. Amplifiers with very large bandwidths may require special designs, such as push-pull coupled transistors in the sub-amplifiers. In such cases the embodiments may be implemented differentially, with a balun at the input to provide differential signal and the rest of the amplifier can be fully differential. Other implementations are also feasible, and the specific circuit techniques used are given by bandwidth and other requirements.

Combinations with other amplifier techniques are also possible. As shown above, the RF output currents and voltages for the previous sets at the transition point can always be made close enough to their values at the full output. That means that any amplifier made with any technique can substitute as a first set and with the rest of the amplifier built according to the present invention.

Figure 33:
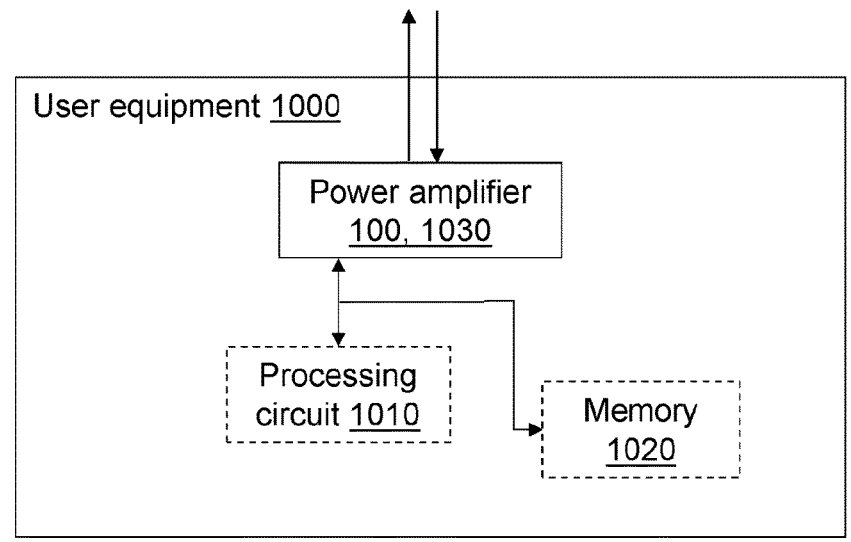
FIG. 33 illustrates an exemplifying radio network node according to embodiments herein.

FIG. 33 shows an exemplifying user equipment 1000.

As used herein, the term "user equipment" may refer to a mobile phone, a cellular phone, a Personal Digital Assistant (PDA) equipped with radio communication capabilities, a smartphone, a laptop or personal computer (PC) equipped with an internal or external mobile broadband modem, a tablet PC with radio communication capabilities, a portable electronic radio communication device, a sensor device equipped with radio communication capabilities or the like. The sensor may be any kind of weather sensor, such as wind, temperature, air pressure, humidity etc. As further examples, the sensor may be a light sensor, an electronic switch, a microphone, a loudspeaker, a camera sensor etc.

The user equipment 1000 may comprise a processing circuit 1010 and/or a memory 1020.

Furthermore, the user equipment 1000 comprises the composite power amplifier 100 according to the embodiments described above. Expressed differently, the user equipment 1000 may comprise a composite power amplifier 1030, which may be the composite power amplifier 100 as disclosed herein.

The user equipment 1000 may further comprise additional transceiver circuitry (not shown) for facilitating transmission and reception of data, e.g. in the form of radio signals.

Figure 34:
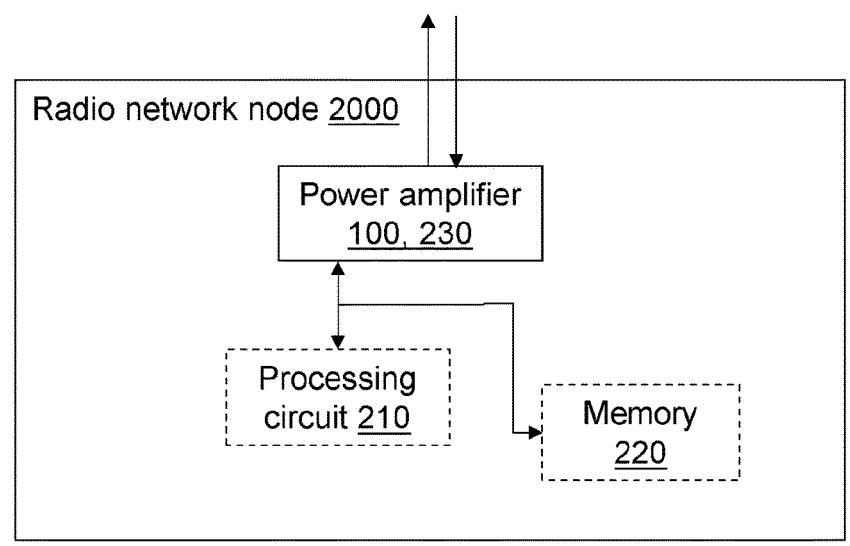
FIG. 34 illustrates an exemplifying user equipment according to embodiments herein.

FIG. 34 shows an exemplifying radio network node 2000.

As used herein, the term "radio network node" may refer to is a piece of equipment that facilitates wireless communication between user equipment (UE) and a network. Accordingly, the term "radio network node" may refer to a Base Station (BS), a Base Transceiver Station (BTS), a Radio Base Station (RBS), a NodeB in so called Third Generation (3G) networks, evolved Node B, eNodeB or eNB in Long Term Evolution (LTE) networks, or the like. In UMTS Terrestrial Radio Access Network (UTRAN) networks, where UTMS is short for Universal Mobile Telecommunications System, the term "radio network node" may also refer to a Radio Network Controller. Furthermore, in Global System for Mobile Communications (GSM) EDGE Radio Access Network (GERAN), where EDGE is short for Enhanced Data rates for GSM Evolution, the term "radio network node" may also refer to a Base Station Controller (BSC).

The radio network node 2000 may comprise a processing circuit 210 and/or a memory 220.

Furthermore, the radio network node 2000 comprises the composite power amplifier 100 according to the embodiments described above. Expressed differently, the radio network node 2000 may comprise a composite power amplifier 230, which may be the composite power amplifier 100 as disclosed herein.

The radio network node 2000 may further comprise additional transceiver circuitry (not shown) for facilitating transmission and reception of data, e.g. in the form of radio signals.

As used herein, the term "processing circuit" may be a processing unit, a processor, an Application Specific Integrated Circuit (ASIC), a Field-Programmable Gate Array (FPGA) or the like. As an example, a processor, an ASIC, an FPGA or the like may comprise one or more processor kernels. In some examples, the processing circuit may be embodied by a software or hardware module. Any such module may be a determining means, estimating means, capturing means, associating means, comparing means, identification means, selecting means, receiving means, transmitting means or the like as disclosed herein. As an example, the expression "means" may be a unit, such as a determining unit, selecting unit, etc. As used herein, the term "memory" may refer to a hard disk, a magnetic storage medium, a portable computer diskette or disc, flash memory, random access memory (RAM) or the like. Furthermore, the term "memory" may refer to an internal register memory of a processor or the like.

As used herein, the terms "number", "value" may be any kind of digit, such as binary, real, imaginary or rational number or the like. Moreover, "number", "value" may be one or more characters, such as a letter or a string of letters. The terms "number", "value" may also be represented by a bit string, i.e. a string of bits.

As used herein, the expression "in some embodiments" has been used to indicate that the features of the embodiment described may be combined with any other embodiment disclosed herein.

Even though embodiments of the various aspects have been described, many different alterations, modifications and the like thereof will become apparent for those skilled in the art. The described embodiments are therefore not intended to limit the scope of the present disclosure.

The invention claimed is:

1. A composite power amplifier for amplification of an input signal into an output signal, wherein the composite power amplifier comprises:
    an input port for receiving the input signal,
    an output port for providing the output signal,
    a first set of sub-amplifiers, comprising at least two sub-amplifiers, wherein the at least two sub-amplifiers are arranged along a taper of a first transmission line, wherein the first transmission line is connected to the first set of sub-amplifiers and the output port,
    a second set of sub-amplifiers, comprising at least two sub-amplifiers, wherein the at least two sub-amplifiers are arranged along a taper of a second transmission line, wherein the second transmission line is connected to the second set of sub-amplifiers and the output port,
    wherein the composite power amplifier is configured with a first transition point related to amplitude of the input signal, wherein the composite power amplifier further comprises:
    a third set of sub-amplifiers, comprising at least two sub-amplifiers, wherein the third set of sub-amplifiers are arranged along a taper of a third transmission line, wherein the third transmission line is connected to the third set of sub-amplifiers and the output port, wherein the composite power amplifier is configured to operate only the third set of sub-amplifiers below the first transition point.

2. The composite power amplifier according to claim 1, wherein the composite power amplifier is configured to operate only the first set of sub-amplifiers below the first transition point.

3. The composite power amplifier according to claim 1, wherein the composite power amplifier is configured with a second transition point related to amplitude of the input signal, wherein the composite power amplifier is configured to:

operate only the first and third sets of sub-amplifiers from the first transition point to the second transition point; and operate only the first, second and third sets of sub-amplifiers above the second transition point.

4. The composite power amplifier according to claim 1, wherein the composite power amplifier is configured to match time delay distribution of signals, received by the first set of sub-amplifiers, to the first transmission line to obtain in-phase combing of signals, amplified by the first set of sub-amplifiers, at the output port.

5. The composite power amplifier according to claim 1, wherein the composite power amplifier is configured to match time delay distribution of signals, received by the second set of sub-amplifiers, to the second transmission line to obtain in-phase combing of signals, amplified by the second set of sub-amplifiers, at the output port.

6. The composite power amplifier according to claim 3, wherein the composite power amplifier is configured to match time delay distribution of signals, received by the third set of sub-amplifiers, to the third transmission line to obtain in-phase combining of signals, amplified by the third set of sub-amplifiers, at the output port.

7. The composite power amplifier according to claim 1, wherein the composite power amplifier comprises:

a fourth set of sub-amplifiers, comprising at least two sub-amplifiers, wherein the at least two sub-amplifiers are arranged along a taper of a fourth transmission line, wherein the fourth transmission line is connected to the fourth set of sub-amplifiers and the output port, wherein the composite power amplifier is configured to operate only the fourth set of sub-amplifiers above a third transition point related to amplitude of the input signal.

8. A user equipment comprising the composite power amplifier according to claim 1.

9. A radio network node comprising the composite power amplifier according to claim 1.

\* \* \* \* \*

UNITED STATES PATENT AND TRADEMARK OFFICE
CERTIFICATE OF CORRECTION

PATENT NO. : 10,205,424 B2
APPLICATION NO. : 15/568891
DATED : February 12, 2019
INVENTOR(S) : Richard Hellberg It is certified that error appears in the above-identified patent and that said Letters Patent is hereby corrected as shown below:

In the Specification

In Column 5, Line 31, delete "the their" and insert -- their --, therefor.

In Column 6, Line 37, delete "0.25 Å," and insert -- 0.25 λ, --, therefor.

In Column 6, Lines 41-42, delete "0.25 Å." and insert -- 0.25 λ. --, therefor.

In Column 12, Line 56, delete "Wth" and insert -- With --, therefor.

Signed and Sealed this
Twenty-first Day of May, 2019

Andrei Iancu
*Director of the United States Patent and Trademark Office*